(12) United States Patent
Takaoka

(10) Patent No.: US 11,088,243 B2
(45) Date of Patent: Aug. 10, 2021

(54) SEMICONDUCTOR DEVICE

(71) Applicant: ROHM CO., LTD., Kyoto (JP)

(72) Inventor: Jun Takaoka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/923,967

(22) Filed: Jul. 8, 2020

(65) Prior Publication Data

US 2020/0343337 A1 Oct. 29, 2020

Related U.S. Application Data

(63) Continuation of application No. 16/271,241, filed on Feb. 8, 2019, now Pat. No. 10,741,637.

(30) Foreign Application Priority Data

Feb. 9, 2018 (JP) .............................. JP2018-022127

(51) Int. Cl.
*H01L 29/06* (2006.01)
*H01L 29/739* (2006.01)
(Continued)

(52) U.S. Cl.
CPC ...... *H01L 29/0619* (2013.01); *H01L 29/0623* (2013.01); *H01L 29/0696* (2013.01); *H01L 29/402* (2013.01); *H01L 29/404* (2013.01); *H01L 29/66348* (2013.01); *H01L 29/66734* (2013.01); *H01L 29/7395* (2013.01); *H01L 29/7397* (2013.01); *H01L 29/7811* (2013.01); *H01L 29/7813* (2013.01)

(58) Field of Classification Search
CPC ............. H01L 29/7813; H01L 29/0619; H01L 29/66734; H01L 29/404; H01L 29/7811; H01L 29/7395; H01L 29/7397; H01L 29/0696; H01L 29/0623; H01L 29/66348
See application file for complete search history.

(56) References Cited

U.S. PATENT DOCUMENTS 5,028,548 A * 7/1991 Nguyen ............ H01L 29/0619
438/488
5,079,608 A  1/1992 Vvodarczyk et al.
(Continued)

FOREIGN PATENT DOCUMENTS

JP    2003158258    5/2003

*Primary Examiner* — Jose R Diaz
(74) *Attorney, Agent, or Firm* — Gregory M. Howison

(57) ABSTRACT

A semiconductor device includes a semiconductor layer of a first conductivity type having a device forming region and an outside region, an impurity region of a second conductivity type formed in a surface layer portion of a first main surface in the device forming region, a field limiting region of a second conductivity type formed in the surface layer portion in the outside region and having a impurity concentration higher than that of the impurity region, and a well region of a second conductivity type formed in a region between the device forming region and the field limiting region in the surface layer portion in the outside region, having a bottom portion positioned at a second main surface side with respect to bottom portions of the impurity region and the field limiting region, and having a impurity concentration higher than that of the impurity region.

21 Claims, 25 Drawing Sheets

(51) Int. Cl.
*H01L 29/40* (2006.01)
*H01L 29/66* (2006.01)
*H01L 29/78* (2006.01)

(56) References Cited

U.S. PATENT DOCUMENTS

| | | |
|---|---|---|
| 6,894,319 B2 | 5/2005 | Kobayashi et al. |
| 9,287,393 B2 | 3/2016 | Miyakoshi |
| 9,853,139 B2 * | 12/2017 | Takaya ................ H01L 29/0623 |
| 10,741,637 B2 * | 8/2020 | Takaoka .............. H01L 29/0623 |
| 2013/0214394 A1 * | 8/2013 | Senoo ................ H01L 29/7395 |
| | | 257/629 |
| 2019/0131412 A1 * | 5/2019 | Ozaki ................ H01L 29/0615 |

\* cited by examiner

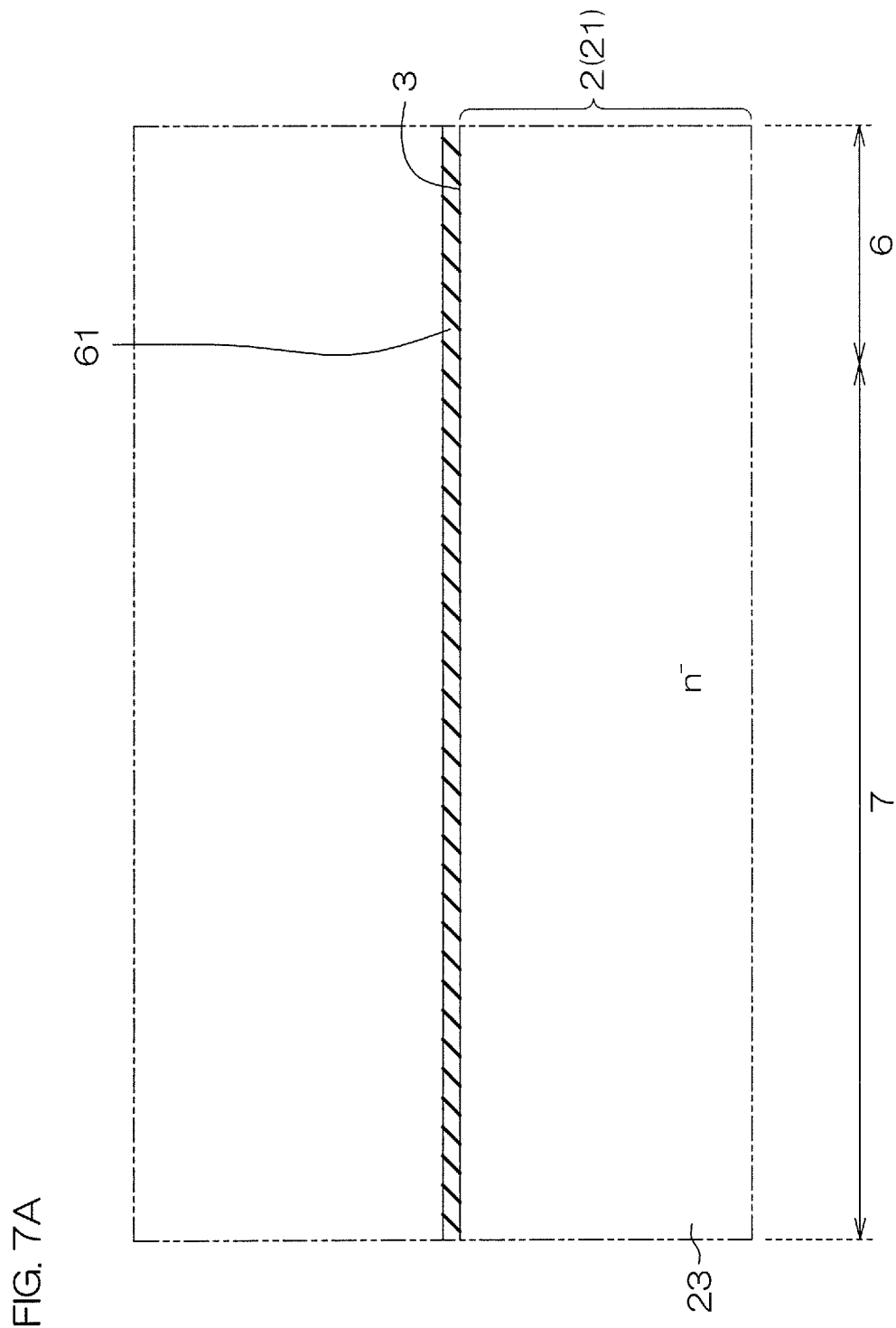

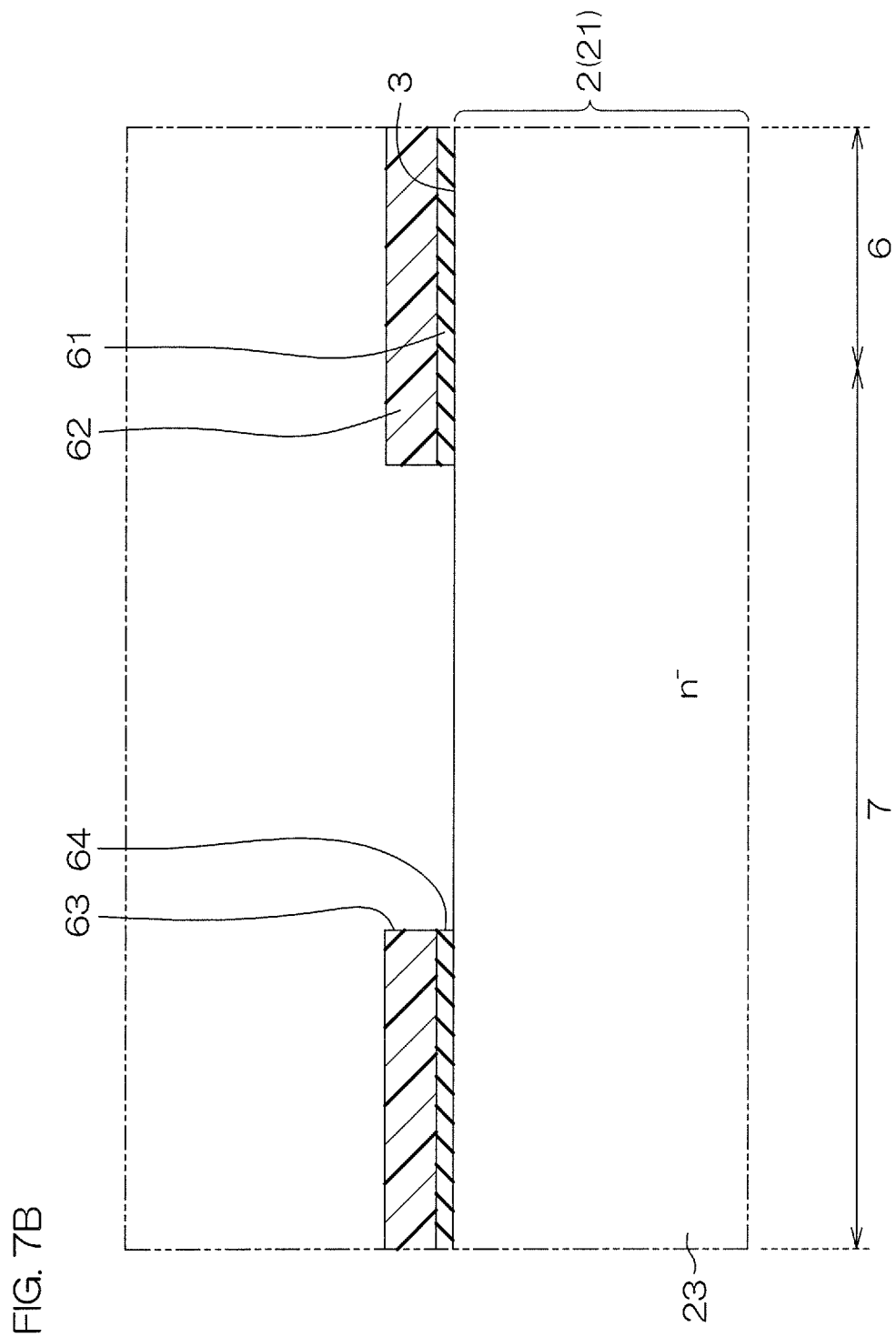

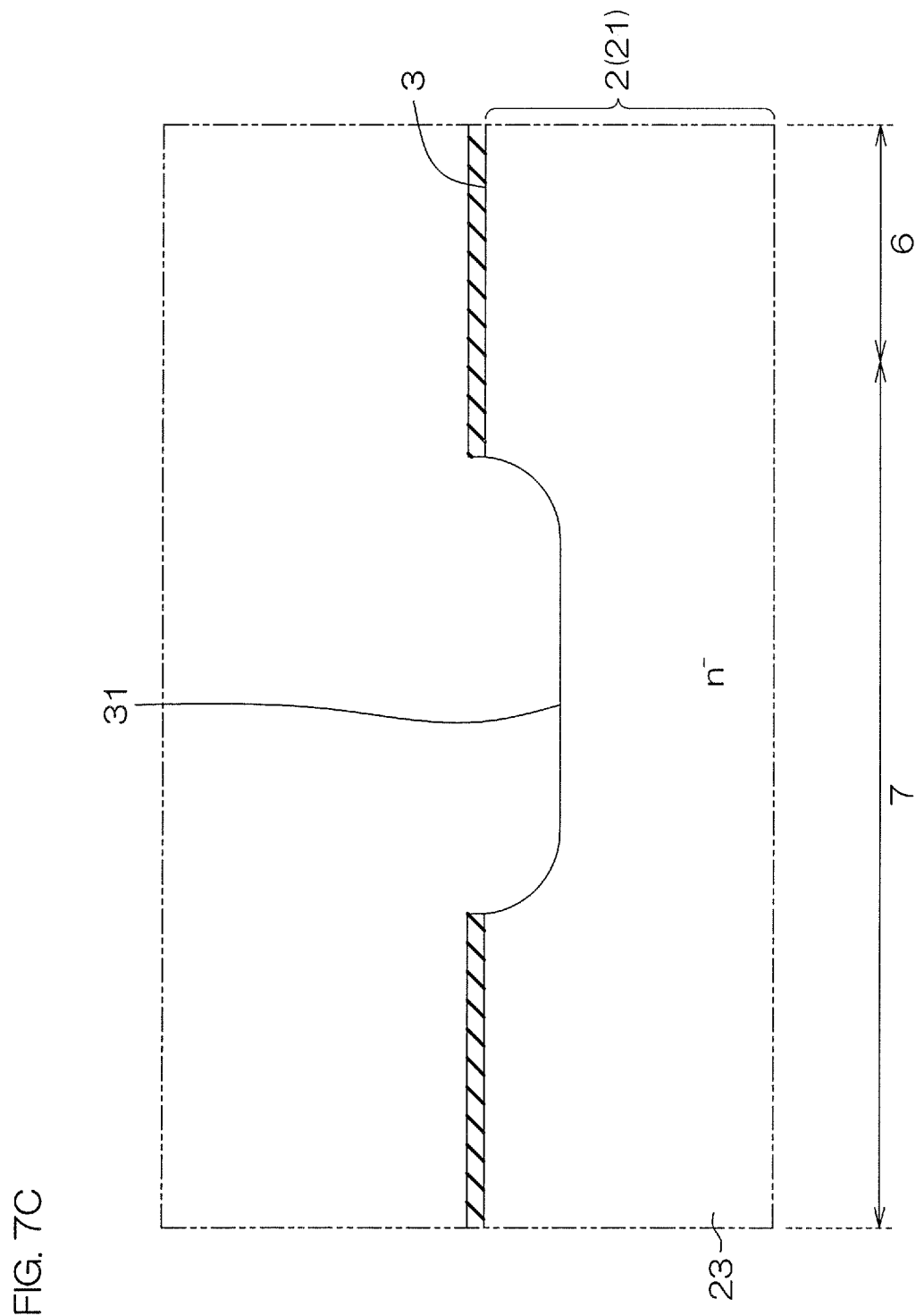

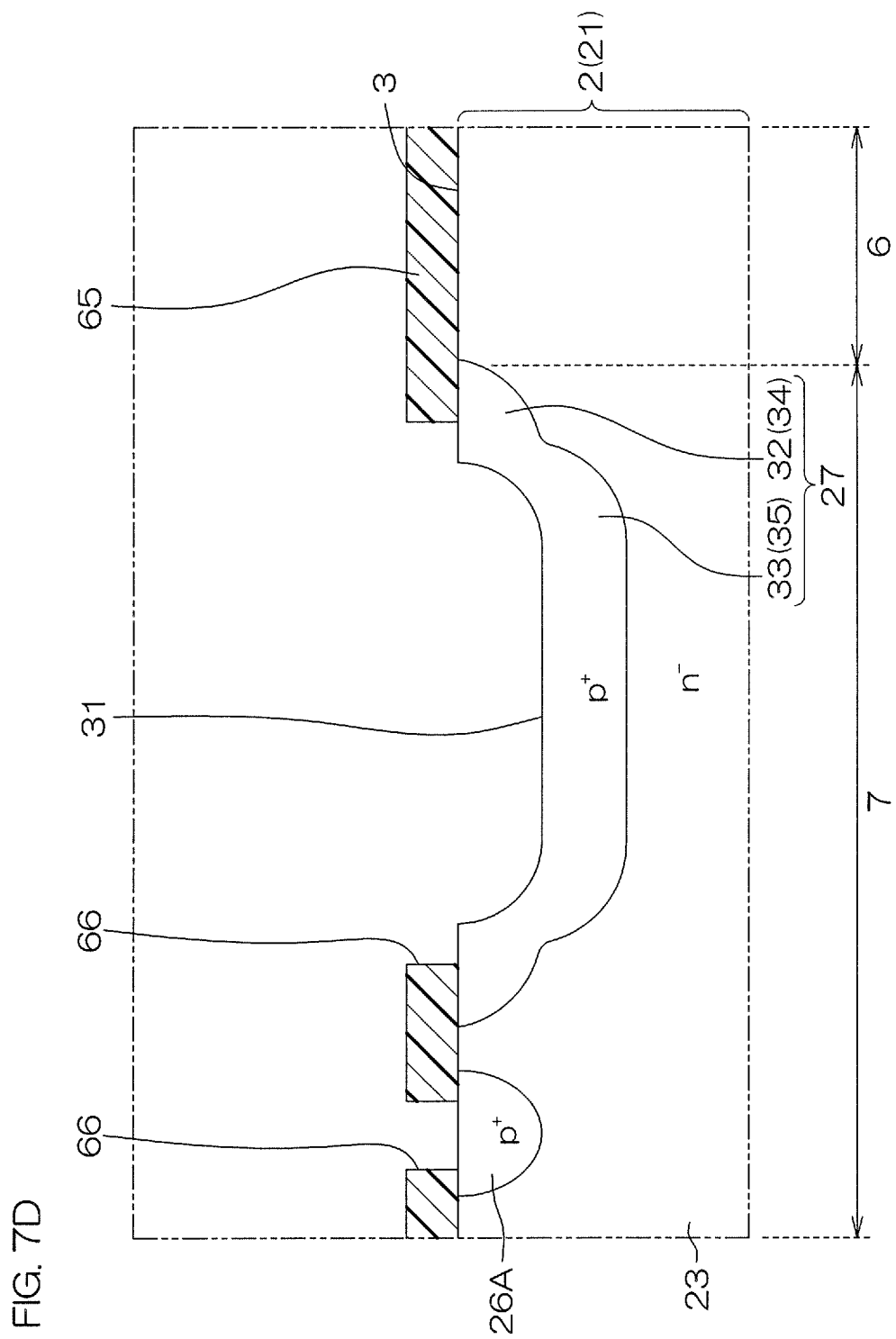

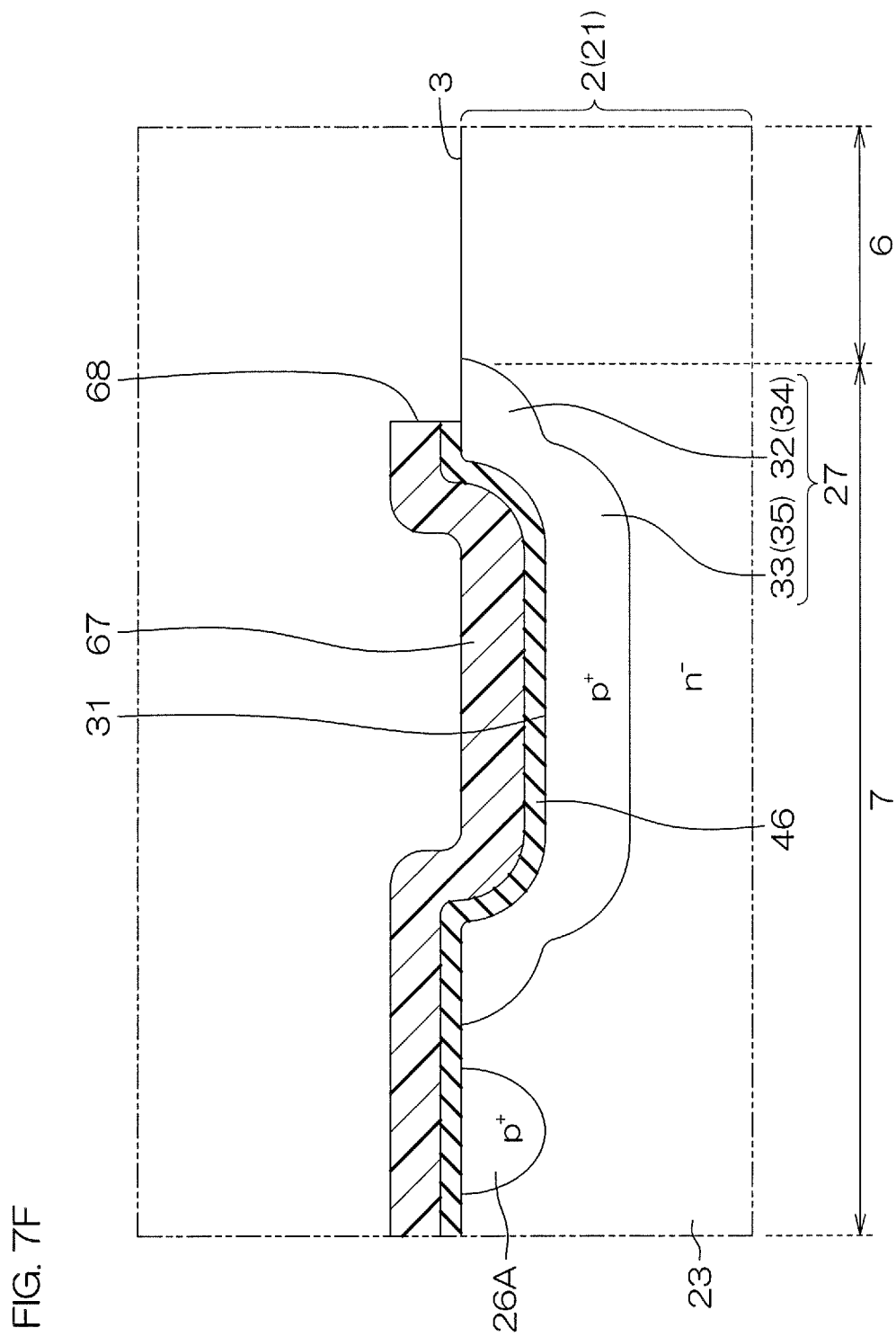

SEMICONDUCTOR DEVICE

CROSS-REFERENCE TO RELATED APPLICATIONS

This application is a continuation of U.S. patent application Ser. No. 16/271,241, filed Feb. 8, 2019, entitled SEMICONDUCTOR DEVICE, which claims priority to and/or benefit from Japanese Patent Application No. 2018-022127 filed on Feb. 9, 2018. The entire contents of the application are hereby incorporated herein by reference.

BACKGROUND OF THE INVENTION

1. Field of the Invention

The present invention relates to a semiconductor device.

2. Description of the Related Art

A semiconductor device according to JP2003-158258A includes an n-type semiconductor layer in which an active region and a termination region are set. In the active region, a p-type base layer is formed in a surface layer portion of the semiconductor layer.

In the termination region, a p-type field limiting ring layer (field limiting region) is formed in the surface layer portion of the semiconductor layer. In the termination region, a p-type well layer is formed in a region between the base layer and the field limiting ring layer in the surface layer portion of the semiconductor layer.

SUMMARY OF THE INVENTION

A preferred embodiment of the present invention provides a semiconductor device including a semiconductor layer of a first conductivity type having a first main surface on one side and a second main surface on the other side, the semiconductor layer in which a device forming region and an outside region outside the device forming region are set on the first main surface, an impurity region of a second conductivity type formed in a surface layer portion of the first main surface of the semiconductor layer in the device forming region, the impurity region forming part of a semiconductor functional device, a field limiting region of a second conductivity type formed in the surface layer portion of the first main surface of the semiconductor layer in the outside region while being spaced from the device forming region, the field limiting region having a second conductivity type impurity concentration higher than a second conductivity type impurity concentration of the impurity region, and a well region of a second conductivity type formed in a region between the device forming region and the field limiting region in the surface layer portion of the first main surface of the semiconductor layer in the outside region, the well region having a bottom portion positioned at the second main surface side of the semiconductor layer with respect to a bottom portion of the impurity region and a bottom portion of the field limiting region, the well region having a second conductivity type impurity concentration higher than the second conductivity type impurity concentration of the impurity region.

Another preferred embodiment of the present invention provides a semiconductor device including a semiconductor layer of a first conductivity type having a first main surface on one side and a second main surface on the other side, the semiconductor layer in which a device forming region and an outside region outside the device forming region are set on the first main surface, an impurity region of a second conductivity type formed in a surface layer portion of the first main surface of the semiconductor layer in the device forming region, the impurity region forming part of a semiconductor functional device, a field limiting region of a second conductivity type formed in the surface layer portion of the first main surface of the semiconductor layer in the outside region while being spaced from the device forming region, the field limiting region having a second conductivity type impurity concentration higher than a second conductivity type impurity concentration of the impurity region, a well region of a second conductivity type formed in a region between the device forming region and the field limiting region in the surface layer portion of the first main surface of the semiconductor layer in the outside region, the well region having a bottom portion positioned at the second main surface side of the semiconductor layer with respect to a bottom portion of the impurity region and a bottom portion of the field limiting region, the well region having a second conductivity type impurity concentration higher than the second conductivity type impurity concentration of the impurity region, and a main surface electrode formed on the first main surface of the semiconductor layer, the main surface electrode having a first connection portion connected to the impurity region and a second connection portion connected to the well region.

The aforementioned or other objects, features, and effects of the present invention will be clarified by the following description of preferred embodiments given below with reference to the accompanying drawings.

BRIEF DESCRIPTION OF THE DRAWINGS

FIGS. 7A to 7M are sectional views of parts corresponding to FIG. 4, the sectional views for explaining an example of a manufacturing method of the semiconductor device shown in FIG. 1.

DETAILED DESCRIPTION OF THE PREFERRED EMBODIMENTS

Figure 1:
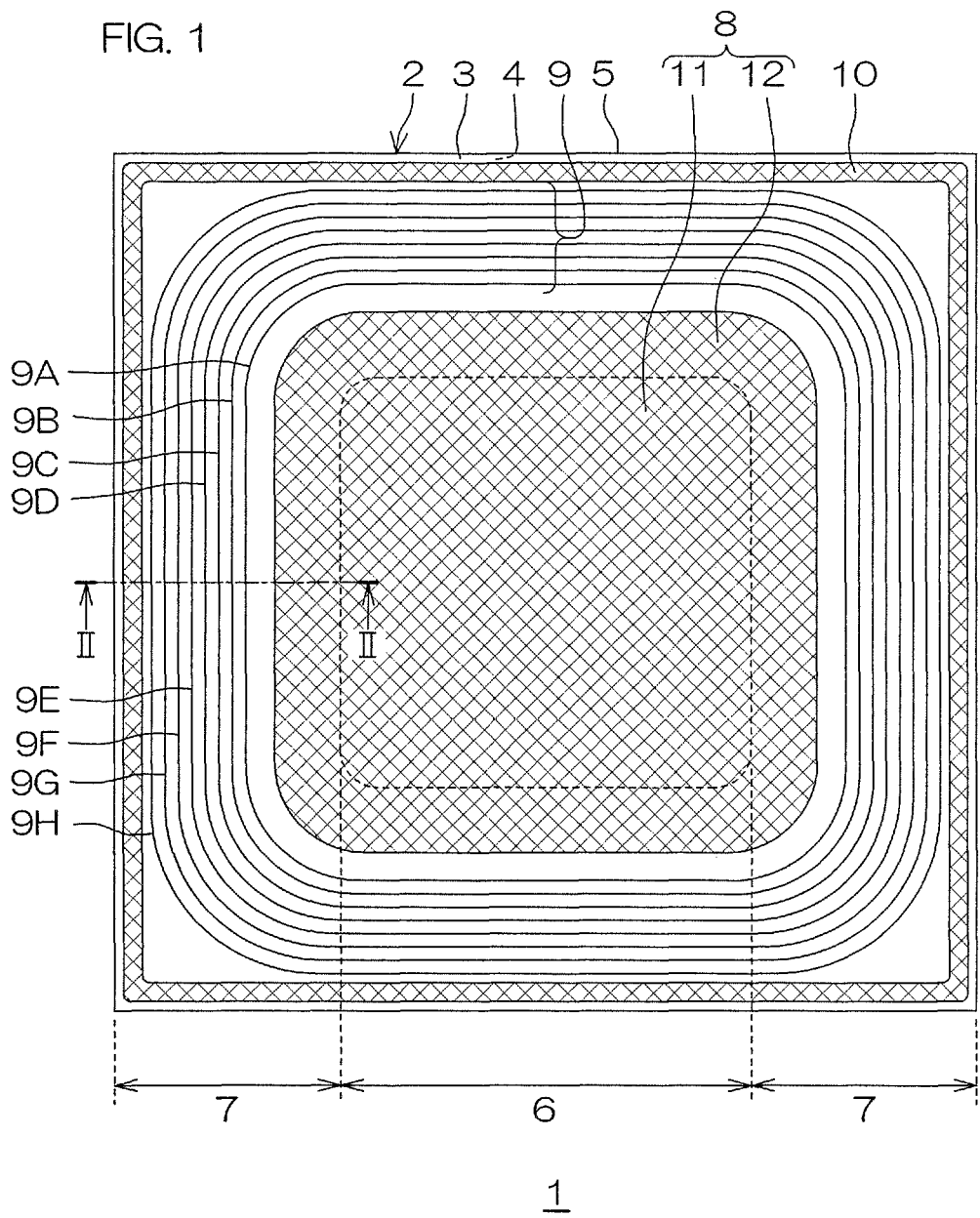
FIG. 1 is a plan view showing a semiconductor device according to a first preferred embodiment of the present invention.

With the semiconductor device according to JP2003-158258A, a withstand voltage is improved by the field limiting region. However, the withstand voltage of the semiconductor device can take various values depending on layout of the field limiting region. Thus, optimization of a design of the field limiting region requires a sufficient amount of care and time. For example, the withstand voltage can be improved to a large extent by the design of the field limiting region. However, in a case where fine adjustment of the withstand voltage is demanded, it is extremely difficult only by the design of the field limiting region.

Thus, a preferred embodiment of the present invention provides a semiconductor device with which withstand voltage can be properly adjusted.

The preferred embodiment of the present invention provides a semiconductor device including a semiconductor layer of a first conductivity type having a first main surface on one side and a second main surface on the other side, the semiconductor layer in which a device forming region and an outside region outside the device forming region are set on the first main surface, an impurity region of a second conductivity type formed in a surface layer portion of the first main surface of the semiconductor layer in the device forming region, the impurity region forming part of a semiconductor functional device, a field limiting region of a second conductivity type formed in the surface layer portion of the first main surface of the semiconductor layer in the outside region while being spaced from the device forming region, the field limiting region having a second conductivity type impurity concentration higher than a second conductivity type impurity concentration of the impurity region, and a well region of a second conductivity type formed in a region between the device forming region and the field limiting region in the surface layer portion of the first main surface of the semiconductor layer in the outside region, the well region having a bottom portion positioned at the second main surface side of the semiconductor layer with respect to a bottom portion of the impurity region and a bottom portion of the field limiting region, the well region having a second conductivity type impurity concentration higher than the second conductivity type impurity concentration of the impurity region.

With this semiconductor device, in addition to a design of the field limiting region, depth of the well region can be included in parameters of withstand voltage adjustment. More specifically, the well region has the bottom portion positioned at the second main surface side of the semiconductor layer with respect to the bottom portion of the impurity region and the bottom portion of the field limiting region.

Thereby, apparent thickness of the semiconductor layer can be reduced in the region where the well region is formed. Thus, electric field intensity for the well region is enhanced, so that the withstand voltage can be lowered. A lowered amount of the withstand voltage can be adjusted by adjusting the depth of the well region.

Therefore, with this semiconductor device, by purposely utilizing a negative effect of withstand voltage lowering due to the depth of the well region, the withstand voltage increased by the field limiting region can be lowered to match a target withstand voltage value. Thus, it is possible to provide the semiconductor device with which the withstand voltage can be properly adjusted.

Another preferred embodiment of the present invention provides a semiconductor device including a semiconductor layer of a first conductivity type having a first main surface on one side and a second main surface on the other side, the semiconductor layer in which a device forming region and an outside region outside the device forming region are set on the first main surface, an impurity region of a second conductivity type formed in a surface layer portion of the first main surface of the semiconductor layer in the device forming region, the impurity region forming part of a semiconductor functional device, a field limiting region of a second conductivity type formed in the surface layer portion of the first main surface of the semiconductor layer in the outside region while being spaced from the device forming region, the field limiting region having a second conductivity type impurity concentration higher than a second conductivity type impurity concentration of the impurity region, a well region of a second conductivity type formed in a region between the device forming region and the field limiting region in the surface layer portion of the first main surface of the semiconductor layer in the outside region, the well region having a bottom portion positioned at the second main surface side of the semiconductor layer with respect to a bottom portion of the impurity region and a bottom portion of the field limiting region, the well region having a second conductivity type impurity concentration higher than the second conductivity type impurity concentration of the impurity region, and a main surface electrode formed on the first main surface of the semiconductor layer, the main surface electrode having a first connection portion connected to the impurity region and a second connection portion connected to the well region.

With this semiconductor device, in addition to the design of the field limiting region, the depth of the well region can be included in the parameters of the withstand voltage adjustment. More specifically, the well region has the bottom portion positioned at the second main surface side of the semiconductor layer with respect to the bottom portion of the impurity region and the bottom portion of the field limiting region.

Thereby, the apparent thickness of the semiconductor layer can be reduced in the region where the well region is formed. Thus, the electric field intensity for the well region is enhanced, so that the withstand voltage can be lowered. The lowered amount of the withstand voltage can be adjusted by adjusting the depth of the well region.

Therefore, with this semiconductor device, by purposely utilizing the negative effect of the withstand voltage lowering due to the depth of the well region, the withstand voltage increased by the field limiting region can be lowered to match a target withstand voltage value. Thus, it is possible to provide the semiconductor device with which the withstand voltage can be properly adjusted.

Furthermore, with this semiconductor device, the main surface electrode has the first connection portion connected to the impurity region and the second connection portion connected to the well region. Therefore, at the time of ON/OFF actions, a current from the impurity region can directly flow into the main surface electrode, and a current from the well region can also directly flow into the main surface electrode.

Thereby, an increase in current density can be suppressed in a border region between the impurity region and the well region where the current flowing through the impurity region and the current flowing through the well region join together. As a result, a temperature increase can be suppressed in the border region between the impurity region and the well region. Thus, breakdown tolerance can be improved.

Hereinafter, preferred embodiments of the present invention will be described in detail with reference to the attached drawings.

FIG. 1 is a plan view showing a semiconductor device 1 according to a first preferred embodiment of the present invention.

The semiconductor device 1 includes a semiconductor layer 2 formed in chip-shaped. The semiconductor layer 2 includes a first main surface 3 on one side, a second main surface 4 on the other side, and a side surface 5 connecting the first main surface 3 and the second main surface 4. The first main surface 3 and the second main surface 4 are formed in a square shape in a plan view seen from the normal direction of the surfaces (hereinafter, simply referred to as "in the plan view").

The semiconductor layer 2 includes a device forming region 6 and an outside region 7. The device forming region 6 and the outside region 7 are set on the first main surface 3 of the semiconductor layer 2. The device forming region 6 is a region where a pn junction diode serving as an example of a semiconductor functional device is formed. The device forming region 6 is also called an active region.

The device forming region 6 is set in a central portion of the semiconductor layer 2 while being spaced from the side surface 5 of the semiconductor layer 2 to an inner region in the plan view. The device forming region 6 may be set in a square shape having four sides parallel to the side surface 5 in the plan view.

The outside region 7 is a region outside the device forming region 6. The outside region 7 extends in a band shape along a peripheral edge of the device forming region 6 in the plan view. More specifically, the outside region 7 is set in an endless shape (square ring shape in this embodiment) enclosing the device forming region 6 in the plan view.

An anode electrode 8 (main surface electrode), a field electrode 9, and an equipotential electrode 10 are formed on the first main surface 3. The anode electrode 8 and the equipotential electrode 10 are shown by cross-hatching in FIG. 1. The field electrode 9 is shown by lines in FIG. 1.

The anode electrode 8 covers the device forming region 6. The anode electrode 8 is formed in a square shape having four sides parallel to the side surface 5 in the plan view. The anode electrode 8 includes a main body portion 11 and a lead portion 12.

The main body portion 11 of the anode electrode 8 covers the device forming region 6. The lead portion 12 of the anode electrode 8 is led from the main body portion 11 to the outside region 7 and covers a part of the outside region 7. The led-out width of the lead portion 12 may be not less than 50 µm and not more than 80 µm. The led-out width of the lead portion 12 may be not less than 50 µm and not more than 60 µm, not less than 60 µm and not more than 70 µm, or not less than 70 µm and not more than 80 µm. The led-out width of the lead portion 12 is about 65 µm in this embodiment.

The field electrode 9 is formed in the outside region 7. The field electrode 9 is formed as a field electrode group including plural (eight in this embodiment) field electrodes 9A, 9B, 9C, 9D, 9E, 9F, 9G, 9H.

The field electrodes 9A to 9H are formed in this order while being spaced from each other along the direction away from the device forming region 6. The field electrodes 9A to 9H are in an electrically floating state. The field electrodes 9A to 9H extend in a band shape along the peripheral edge of the device forming region 6 in the plan view. More specifically, the field electrodes 9A to 9H are formed in an endless shape (square ring shape in this embodiment) enclosing the device forming region 6 in the plan view.

The equipotential electrode 10 is formed in a region between the side surface 5 and the field electrode 9 in the outside region 7. The equipotential electrode 10 extends in a band shape along the peripheral edge of the device forming region 6 in the plan view.

More specifically, the equipotential electrode 10 is formed in an endless shape (square ring shape in this embodiment) enclosing the device forming region 6 in the plan view. The equipotential electrode 10 is also called an EQR (Equipotential Ring) electrode.

The equipotential electrode 10 is formed while being spaced from the side surface 5. A distance between an outer peripheral edge of the equipotential electrode 10 and the side surface 5 of the semiconductor layer 2 may be not less than 15 µm and not more than 40 µm. The distance between the equipotential electrode 10 and the side surface 5 may be not less than 15 µm and not more than 20 µm, not less than 20 µm and not more than 25 µm, not less than 25 µm and not more than 30 µm, not less than 30 µm and not more than 35 µm, or not less than 35 µm and not more than 40 µm. The distance between the equipotential electrode 10 and the side surface 5 is about 25 µm in this embodiment.

Figure 2:
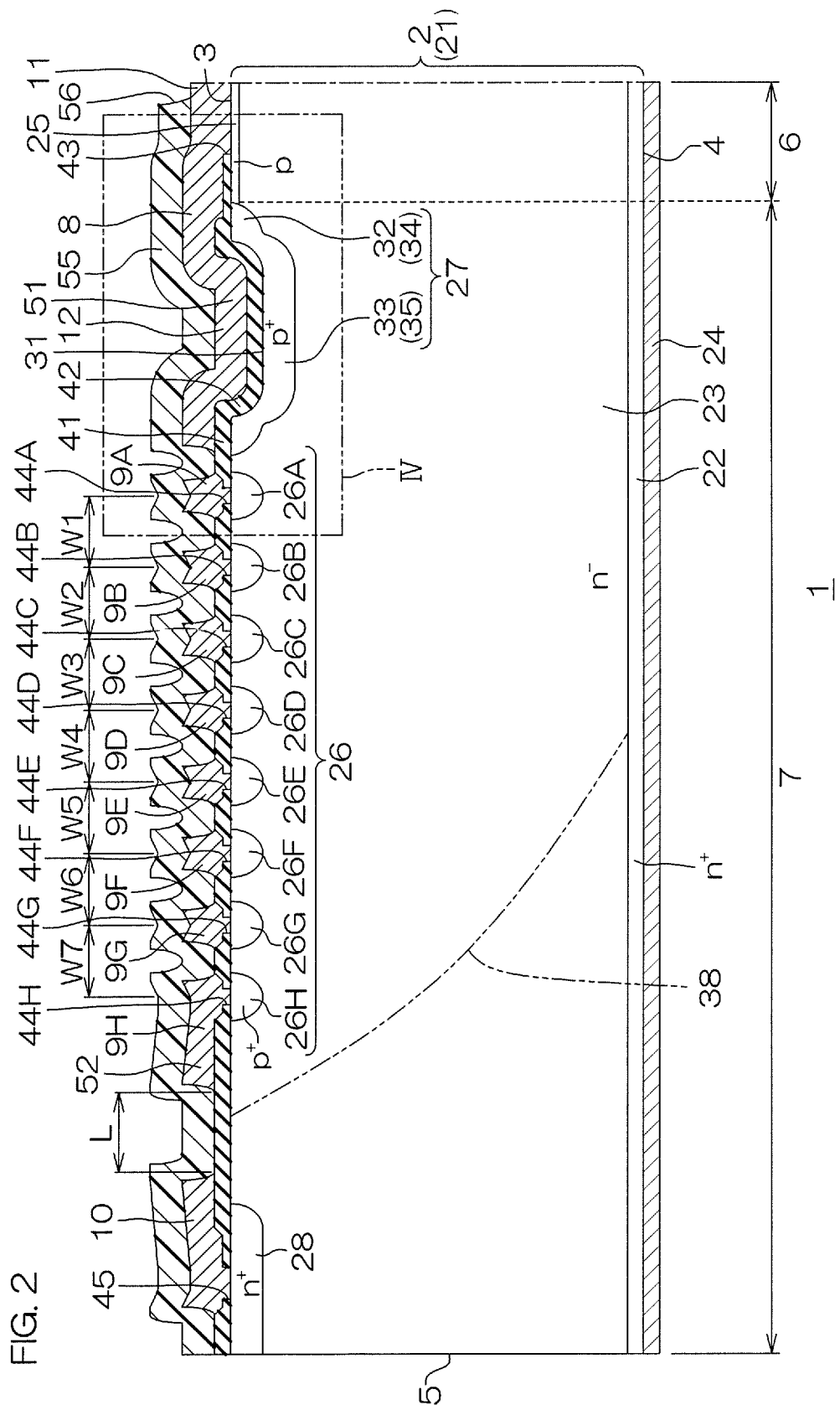
FIG. 2 is a sectional view taken along line II-II shown in FIG. 1.
Figure 3:
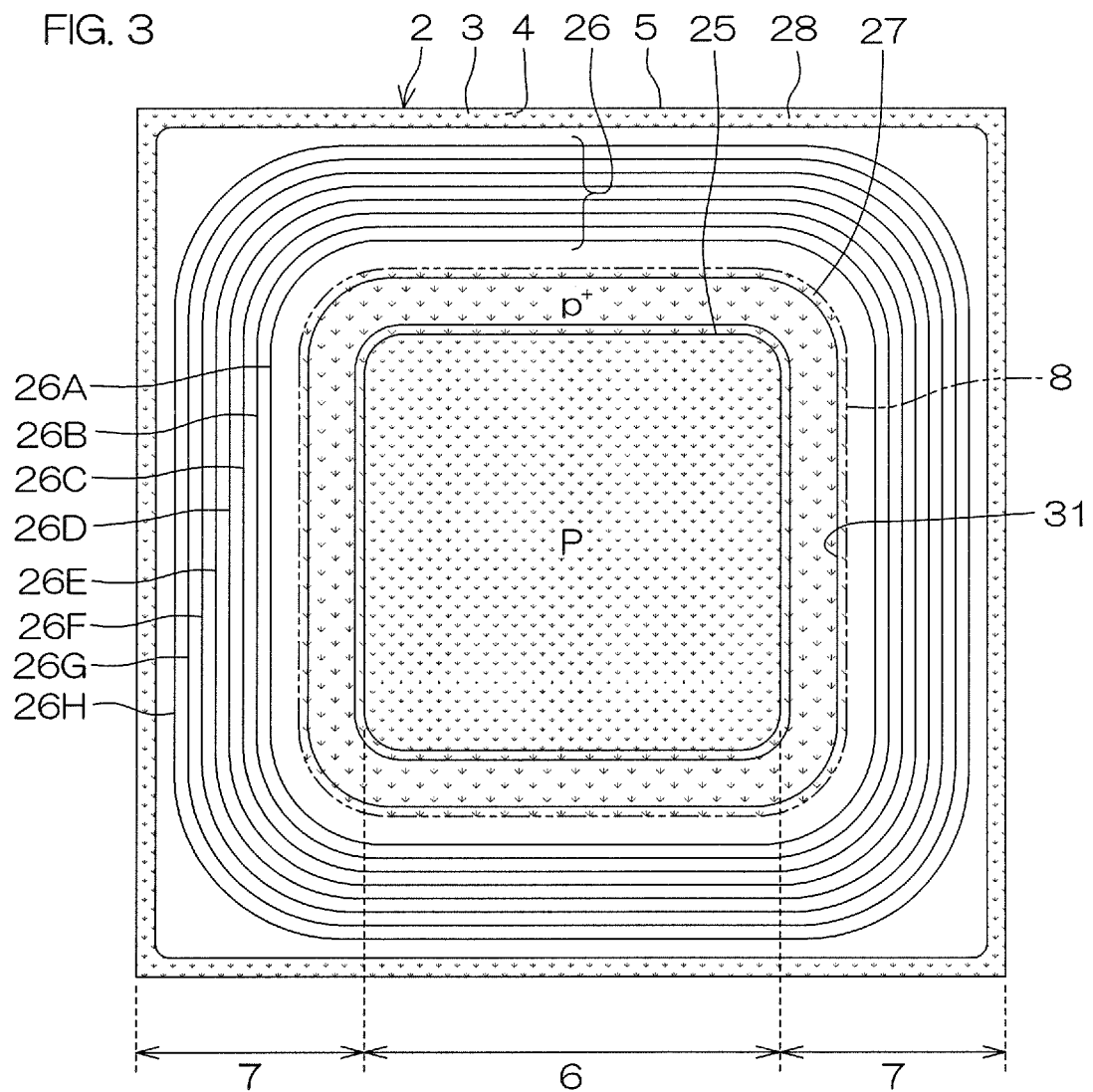
FIG. 3 is a plan view showing a structure of a first main surface of a semiconductor layer by removing a structure above the first main surface of the semiconductor layer from FIG. 1.
Figure 4:
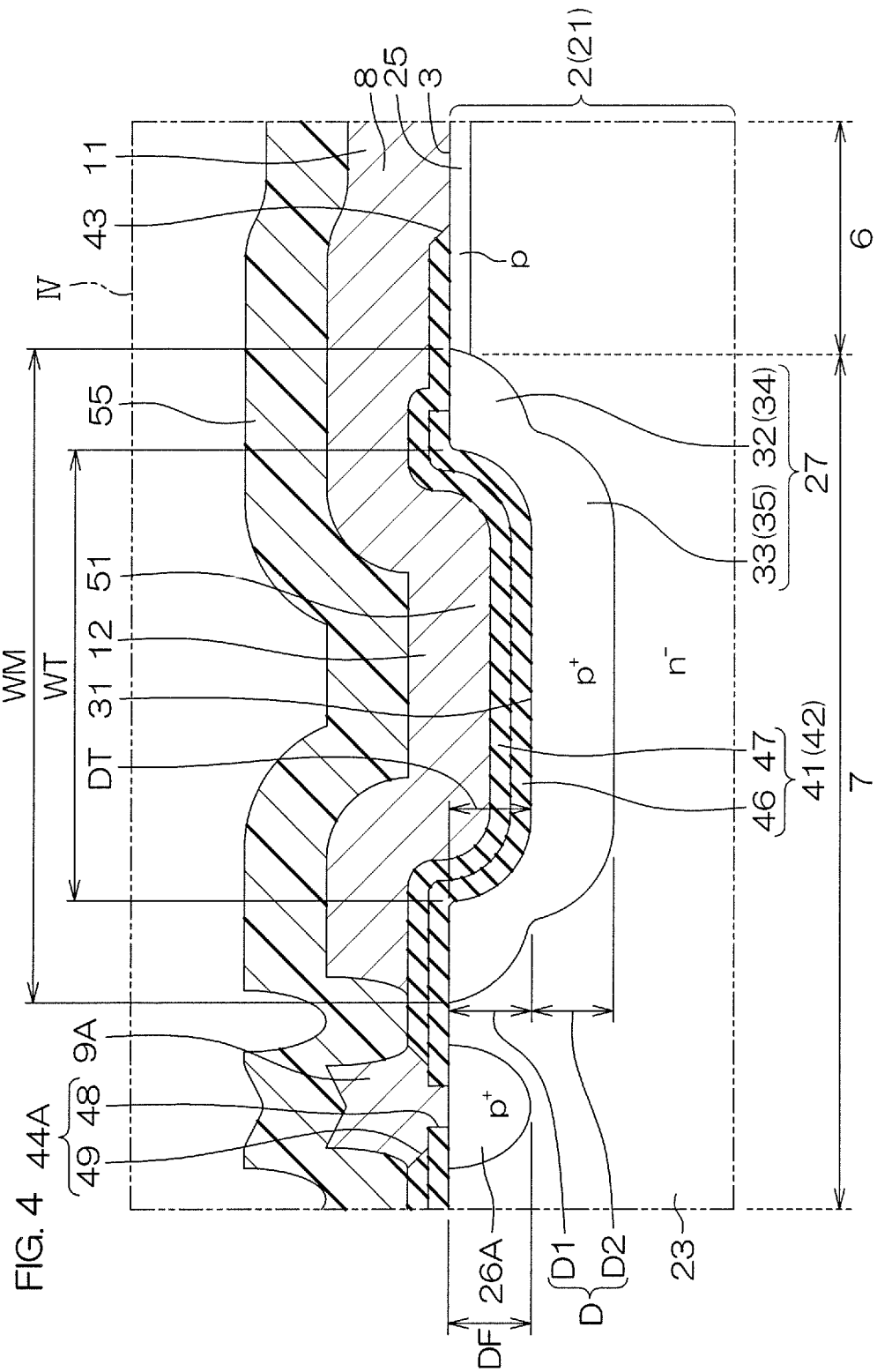
FIG. 4 is an enlarged view of a region IV shown in FIG. 2.

FIG. 2 is a sectional view taken along line II-II shown in FIG. 1. FIG. 3 is a plan view showing a structure of the first main surface 3 of the semiconductor layer 2 by removing a structure above the first main surface 3 of the semiconductor layer 2 from FIG. 1. FIG. 4 is an enlarged view of a region IV shown in FIG. 2.

With reference to FIG. 2, the semiconductor layer 2 has a single layer structure including an $n^-$-type semiconductor substrate 21. The semiconductor substrate 21 may be a silicon single-crystal substrate (so-called FZ substrate) formed through the FZ (Floating Zone) method.

In a surface layer portion of the second main surface 4 of the semiconductor layer 2, an $n^+$-type high concentration region 22 is formed. A region outside the high concentration region 22 in the semiconductor layer 2 is formed as a drift region 23. A cathode electrode 24 is formed on the second main surface 4 of the semiconductor layer 2. The cathode electrode 24 forms an ohmic junction with the high concentration region 22.

With reference to FIGS. 2 and 3, in a surface layer portion of the first main surface 3 of the semiconductor layer 2, a p-type anode region 25, a $p^+$-type field limiting region 26, a $p^+$-type well region 27, and an $n^+$-type channel stop region 28 are formed.

The field limiting region 26, the well region 27, and the $n^+$-type channel stop region 28 are shown by dot-shaped hatching in FIG. 3. The field limiting region 26 is shown by lines in FIG. 3.

The anode region 25 is formed in the surface layer portion of the first main surface 3 in the device forming region 6. The anode region 25 is formed in the central portion of the semiconductor layer 2 while being spaced from the side surface 5 to the inner region in the plan view. The anode region 25 may be set in a square shape having four sides parallel to the side surface 5 in the plan view.

The anode region 25 defines the device forming region 6. The anode region 25 forms a pn junction portion between the semiconductor layer 2 (drift region 23) and the anode region. Thereby, a pn junction diode in which the anode region 25 serves as an anode and the semiconductor layer 2 (drift region 23) serves as a cathode is formed. The pn junction diode may be a first recovery diode.

Depth of the anode region 25 may be not less than 0.5 μm and not more than 3.0 μm. The depth of the anode region 25 is a distance between the first main surface 3 and a bottom portion of the anode region 25. The depth of the anode region 25 may be not less than 0.5 μm and not more than 1.0 μm, not less than 1.0 μm and not more than 1.5 μm, not less than 1.5 μm and not more than 2.0 μm, not less than 2.0 μm and not more than 2.5 μm, not less than 2.5 μm and not more than 3.0 μm, or not more than 3.0 μm. The depth of the anode region 25 is about 1.5 μm in this embodiment.

The field limiting region 26 is formed in the surface layer portion of the first main surface 3 in the outside region 7. The field limiting region 26 has a p-type impurity concentration higher than a p-type impurity concentration of the anode region 25.

The field limiting region 26 is formed as a field limiting region group including plural (eight in this embodiment) field limiting regions 26A, 26B, 26C, 26D, 26E, 26F, 26G, 26H.

The field limiting regions 26A to 26H are formed in this order while being spaced from each other along the direction away from the device forming region 6. The field limiting regions 26A to 26H extend in a band shape along a peripheral edge of the anode region 25 in the plan view. More specifically, the field limiting regions 26A to 26H are formed in an endless shape (square ring shape in this embodiment) enclosing the anode region 25 in the plan view. The field limiting regions 26A to 26H are also called FLR (Field Limiting Ring) regions.

Bottom portions of the field limiting regions 26A to 26H are positioned at the second main surface 4 side with respect to the bottom portion of the anode region 25. Depth DF of the field limiting regions 26A to 26H may be not less than 5 μm and not more than 10 μm. The depth DF of the field limiting regions 26A to 26H is a distance between the first main surface 3 and each of the bottom portions of the field limiting regions 26A to 26H.

The depth DF of the field limiting regions 26A to 26H may be not less than 5 μm and not more than 6 μm, not less than 6 μm and not more than 7 μm, not less than 7 μm and not more than 8 μm, not less than 8 μm and not more than 9 μm, or not less than 9 μm and not more than 10 μm. The depth DF of the field limiting regions 26A to 26H is about 7.5 μm in this embodiment.

Width of the field limiting regions 26A to 26H may be not less than 10 μm and not more than 40 μm (for example, about 25 μm). The width of the field limiting regions 26A to 26H may be not less than 10 μm and not more than 20 μm, not less than 20 μm and not more than 30 μm, or not less than 30 μm and not more than 40 μm. The width of the field limiting regions 26A to 26H is about 25 μm in this embodiment.

Distances W1 to W7 between the adjacent field limiting regions 26A to 26H may be wider toward the opposite side of the anode region 25. The distances W1 to W7 are distances between the field limiting regions 26A to 26H measured with reference to central portions of the field limiting regions 26A to 26H in this embodiment.

The distance W1 may be not less than 15 μm and not more than 17 μm (for example, about 16 μm). The distance W2 may be not less than 17 μm and not more than 19 μm (for example, about 18 μm). The distance W3 may be not less than 18 μm and not more than 20 μm (for example, about 19 μm).

The distance W4 may be not less than 20 μm and not more than 22 μm (for example, about 21 μm). The distance W5 may be not less than 22 μm and not more than 24 μm (for example, about 23 μm). The distance W6 may be not less than 25 μm and not more than 27 μm (for example, about 26 μm). The distance W7 may be not less than 28 μm and not more than 30 μm (for example, about 29 μm).

The well region 27 is formed in the surface layer portion of the first main surface 3 in the outside region 7. More specifically, the well region 27 is formed in a region between the anode region 25 and the field limiting region 26 in the surface layer portion of the first main surface 3.

The well region 27 has a p-type impurity concentration higher than the p-type impurity concentration of the anode region 25. The p-type impurity concentration of the well region 27 may be equal to the p-type impurity concentration of the field limiting region 26.

The well region 27 extends in a band shape along the peripheral edge of the anode region 25 in the plan view. More specifically, the well region 27 is formed in an endless shape (square ring shape in this embodiment) enclosing the device forming region 6 in the plan view.

The well region 27 is formed as a terminal region that ends the anode region 25 in the outside region 7. An inner peripheral edge of the well region 27 is connected to the peripheral edge of the anode region 25. The inner peripheral edge of the well region 27 may overlap the peripheral edge of the anode region 25 from the bottom portion side of the anode region 25. An outer peripheral edge of the well region 27 is formed while being spaced from the field limiting region 26. A distance between the outer peripheral edge of the well region 27 and the field limiting region 26A may be not more than the distance W1.

Regarding the thickness direction of the semiconductor layer 2, a bottom portion of the well region 27 is positioned at the second main surface 4 side of the semiconductor layer 2 with respect to the bottom portion of the anode region 25 and the bottom portion of the field limiting region 26.

Depth D of the well region 27 may be not less than 5 μm and not more than 20 μm. The depth D of the well region 27 is a distance between the first main surface 3 and the bottom portion of the well region 27. The depth D of the well region 27 may be not less than 5 μm and not more than 10 μm, not less than 10 μm and not more than 15 μm, or not less than 15 μm and not more than 20 μm. The depth D of the well region 27 is about 15 μm in this embodiment.

Width WM of the well region 27 may be not less than 10 μm and not more than 100 μm. The width WM of the well region 27 may be not less than 10 μm and not more than 20 μm, not less than 20 μm and not more than 30 μm, not less than 30 μm and not more than 40 μm, not less than 40 μm and not more than 50 μm, not less than 50 μm and not more than 60 μm, not less than 60 μm and not more than 70 μm, not less than 70 μm and not more than 80 μm, not less than 80 μm and not more than 90 μm, or not less than 90 μm and not more than 100 μm. The width WM of the well region 27 is about 20 μm in this embodiment.

With reference to FIGS. 2 to 4, the well region 27 is formed in a region along the trench 31 formed on the first main surface 3 in the surface layer portion of the first main surface 3 in this embodiment. The trench 31 is formed on the first main surface 3 in the outside region 7. More specifically, the trench 31 is formed in the region between the anode region 25 and the field limiting region 26 in the outside region 7.

The trench 31 extends in a band shape along the peripheral edge of the anode region 25 in the plan view. More specifically, the trench 31 is formed in an endless shape (square ring shape in this embodiment) enclosing the device forming region 6 in the plan view.

The trench 31 includes side walls, a bottom wall, and edge portions connecting the side walls and the bottom wall. The edge portions of the trench 31 are formed in a projected and curved shape toward the second main surface 4 side. The trench 31 may be formed in a tapered shape in which an opening area is larger than a bottom area.

Depth DT of the trench 31 may be more than 0 μm and not more than 10 μm. Depth DT of the trench 31 is a distance between the first main surface 3 and the bottom wall of the trench 31. The depth DT of the trench 31 may be more than 0 μm and not more than 2 μm, not less than 2 μm and not more than 4 μm, not less than 4 μm and not more than 6 μm, not less than 6 μm and not more than 8 μm, or not less than 8 μm and not more than 10 μm. The depth DT of the trench 31 is about 5 μm in this embodiment.

Width WT of the trench 31 may be not less than 5 μm and not more than 90 μm. The width WT of the trench 31 may be not less than 5 μm and not more than 15 μm, not less than 15 μm and not more than 30 μm, not less than 30 μm and not more than 45 μm, not less than 45 μm and not more than 60 μm, not less than 60 μm and not more than 75 μm, or not less than 75 μm and not more than 90 μm. The width WT of the trench 31 is about 15 μm in this embodiment.

The well region 27 includes a side wall region 32 formed in regions along the side walls of the trench 31 in the semiconductor layer 2. The side wall region 32 includes an inside wall region formed along the inner peripheral side wall of the trench 31, and an outside wall region formed along the outer peripheral side wall of the trench 31. The side wall region 32 spreads from the side walls of the trench 31 in the direction along the first main surface 3. The side wall region 32 is connected to the anode region 25.

Depth D1 of the side wall region 32 may be not less than 5 μm and not more than 10 μm. The depth D1 of the side wall region 32 is a distance between the first main surface 3 and a bottom portion of the side wall region 32. The depth D1 of the side wall region 32 may be not less than 5 μm and not more than 6 μm, not less than 6 μm and not more than 7 μm, not less than 7 μm and not more than 8 μm, not less than 8 μm and not more than 9 μm, or not less than 9 μm and not more than 10 μm. The depth D1 of the side wall region 32 is about 7.5 μm in this embodiment.

The bottom portion of the side wall region 32 is formed to have depth substantially equal to the bottom portions of the field limiting regions 26A to 26H. The depth D1 of the side wall region 32 is substantially equal to the depth DF of the field limiting regions 26A to 26H.

The well region 27 includes a bottom wall region 33 formed in a region along the bottom wall of the trench 31 in the semiconductor layer 2. The bottom wall region 33 spreads from the bottom wall of the trench 31 in the thickness direction of the semiconductor layer 2. The bottom wall region 33 is connected to the side wall region 32 in regions along the edge portions of the trench 31 in the semiconductor layer 2. The bottom wall region 33 forms a step in the connection region to the side wall region 32.

The bottom wall region 33 may be smoothly connected to the side wall region 32. A bottom portion of the bottom wall region 33 is positioned at the second main surface 4 side with respect to the bottom portion of the anode region 25 and the bottom portion of the field limiting region 26.

Depth D2 of the bottom wall region 33 may be more than 0 μm and not more than 10 μm. The depth D2 of the bottom wall region 33 is a distance between the bottom wall of the trench 31 and the bottom portion of the bottom wall region 33. The depth D of the well region 27 is a total value of the depth D1 of the side wall region 32 and the depth D2 of the bottom wall region 33 (D=D1+D2).

The depth D2 of the bottom wall region 33 may be more than 0 μm and not more than 2 μm, not less than 2 μm and not more than 4 μm, not less than 4 μm and not more than 6 μm, not less than 6 μm and not more than 8 μm, or not less than 8 μm and not more than 10 μm. The depth D2 of the bottom wall region 33 is about 7.5 μm in this embodiment.

A distance between the bottom portion of the well region 27 and the second main surface 4 is smaller than a distance between the bottom portion of the field limiting region 26 and the second main surface 4. Apparent thickness of a region of the semiconductor layer 2 where the well region 27 is formed is smaller than apparent thickness of a region of the semiconductor layer 2 where the field limiting region 26 is formed. Electric field intensity for the well region 27 is greater than electric field intensity for the field limiting region 26.

A structure of the well region 27 is also specified by the following mode. That is, the well region 27 includes a first region 34 (side wall region 32) and a second region 35 (bottom wall region 33). The first region 34 (side wall region 32) is formed in the surface layer portion of the first main surface 3. The second region 35 (bottom wall region 33) is formed on the second main surface 4 side with respect to the first region 34. The second region 35 has smaller width than width of the first region 34.

The trench 31 is formed in a surface layer portion of the first region 34. The trench 31 is formed in an inner region of the first region 34. The trench 31 has smaller width than the width of the first region 34. The bottom wall of the trench 31 is positioned in a region between the first main surface 3 of the semiconductor layer 2 and a bottom portion of the second region 35.

The channel stop region 28 is formed in the surface layer portion of the first main surface 3 in the outside region 7. The channel stop region 28 has an n-type impurity concentration higher than an n-type impurity concentration of the semiconductor layer 2.

The channel stop region 28 is formed in a region between the field limiting region 26 and the side surface 5 in the surface layer portion of the first main surface 3. The channel stop region 28 is formed while being spaced from the field limiting region 26. The channel stop region 28 may be exposed from the side surface 5.

The channel stop region 28 extends in a band shape along a peripheral edge of the field limiting region 26 in the plan view. More specifically, the channel stop region 28 is formed in an endless shape (square ring shape in this embodiment) enclosing the field limiting region 26 in the plan view.

Width of the channel stop region 28 may be not less than 80 μm and not more than 110 μm. The width of the channel stop region 28 may be not less than 80 μm and not more than 90 μm, not less than 90 μm and not more than 100 μm, or not less than 100 μm and not more than 110 μm. The width of the channel stop region 28 is about 95 μm in this embodiment.

With reference to FIG. 2, a depletion layer 38 spreading from the device forming region 6 to the outside region 7 is formed in the semiconductor layer 2. In FIG. 2, the depletion layer 38 is shown by double chain lines. More specifically, the depletion layer 38 spreads from the pn junction portion between the anode region 25 and the semiconductor layer 2.

The depletion layer 38 spreading from the device forming region 6 is integrated with a depletion layer spreading from the well region 27 in the outside region 7. The well region 27 is covered by the depletion layer 38 in the semiconductor layer 2. In addition, the depletion layer 38 is integrated with a depletion layer spreading from the field limiting region 26 in the outside region 7. The field limiting region 26 is covered by the depletion layer 38 in the semiconductor layer 2. In this embodiment, the field limiting regions 26A to 26H are covered by the depletion layer 38.

The depletion layer 38 reaches the second main surface 4 of the semiconductor layer 2. The depletion layer 38 reaches an opposing region of the second main surface 4 opposing the well region 27. The depletion layer 38 reaches an opposing region of the second main surface 4 opposing the field limiting region 26 and the well region 27. In this embodiment, the depletion layer 38 reaches up to an opposing region of the second main surface 4 opposing the field limiting region 26D. Width of the depletion layer 38 along the first main surface 3 is gradually reduced from the first main surface 3 along the second main surface 4.

That is, the semiconductor layer 2 has such thickness that the depletion layer 38 reaches the second main surface 4. The semiconductor layer 2 also has such thickness that the depletion layer 38 reaches the opposing region of the second main surface 4 opposing the well region 27. The semiconductor layer 2 also has such thickness that the depletion layer 38 reaches the opposing region of the second main surface 4 opposing the field limiting region 26 and the well region 27.

An insulating layer 41 is formed on the first main surface 3. The insulating layer 41 may include $SiO_2$. In the insulating layer 41, an anode opening 43 from which the anode region 25 is exposed is formed. In this embodiment, from the anode opening 43, an inner region of the anode region 25 excluding the peripheral edge of the anode region 25 is exposed. The insulating layer 41 is formed in an endless shape (square ring shape in this embodiment) to cover the outside region 7 in the plan view.

The insulating layer 41 includes an inner wall insulating layer 42 formed along an inner wall of the trench 31. The inner wall insulating layer 42 is formed in a film shape along the inner wall of the trench 31. The inner wall insulating layer 42 defines a recessed space in the trench 31.

The insulating layer 41 has plural first openings 44A, 44B, 44C, 44D, 44E, 44F, 44G, 44H from which the field limiting regions 26A to 26H are exposed. From the plural first openings 44A to 44H, the corresponding field limiting regions 26A to 26H are respectively exposed. The insulating layer 41 has a second opening 45 from which the channel stop region 28 is exposed.

With reference to FIG. 4, more specifically, the insulating layer 41 has a laminated structure in which plural insulating films are laminated. The plural insulating films include a first insulating film 46 and a second insulating film 47 laminated in this order from the first main surface 3 side. The first insulating film 46 may include an SiN film. The second insulating film 47 may include an $SiO_2$ film having a different property from the first insulating film 46.

The second insulating film 47 may include a PSG (Phosphosilicate Glass) film. The second insulating film 47 may include a BPSG (Boron Phosphorus Silicon Glass) film. The second insulating film 47 may have a laminated structure including a PSG film and a BPSG film laminated in this order from the first insulating film 46 side. The order of laminating the BPSG film and the PSG film may be the other way around.

An end portion of the insulating layer 41 on the device forming region 6 side defines the anode opening 43. That is, the end portion of the insulating layer 41 on the device forming region 6 side is positioned in a region immediately above the anode region 25 on the first main surface 3.

More specifically, an end portion of the first insulating film 46 on the device forming region 6 side in the insulating layer 41 is positioned in a region immediately above the side wall region 32 of the well region 27 on the first main surface 3. An end portion of the second insulating film 47 on the device forming region 6 side covers the end portion of the first insulating film 46 on the device forming region 6 side, and is positioned in the region immediately above the anode region 25 on the first main surface 3. The end portion of the second insulating film 47 on the device forming region 6 side defines the anode opening 43.

Each of the first openings 44A to 44H and the second opening 45 includes a first contact hole 48 and a second contact hole 49. The first contact hole 48 is formed in the first insulating film 46. The second contact hole 49 is formed in the second insulating film 47, and communicates with the first contact hole 48. An opening area of the second contact hole 49 is larger than an opening area of the first contact hole 48. From the second contact hole 49, the first contact hole 48 and a surface of the first insulating film 46 are exposed.

With reference to FIGS. 2 and 4, the main body portion 11 of the anode electrode 8 covers the anode region 25 in the anode opening 43, and is electrically connected to the anode region 25. The lead portion 12 of the anode electrode 8 is led from the main body portion 11 onto the insulating layer 41. The lead portion 12 overlaps the well region 27 in the plan view. The lead portion 12 overlaps the substantially entire well region 27 in the plan view.

An embedded electrode 51 is embedded in the trench 31 while sandwiching the inner wall insulating layer 42. The embedded electrode 51 is formed by a part of the anode electrode 8. More specifically, the lead portion 12 of the anode electrode 8 is led onto the insulating layer 41 to cross the trench 31. Thereby, the anode electrode 8 is embedded in the trench 31 while sandwiching the inner wall insulating layer 42.

The embedded electrode 51 is formed by a part of the anode electrode 8 (lead portion 12), the part being positioned in the trench 31. The embedded electrode 51 has the same electric potential as the anode electrode 8. The embedded electrode 51 opposes the well region 27 while sandwiching the inner wall insulating layer 42. The embedded electrode 51 is insulated from the well region 27 by the inner wall insulating layer 42.

The field electrodes 9A to 9H respectively enter the corresponding first openings 44A to 44H from the upper side of the insulating layer 41. The field electrodes 9A to 9H are electrically connected to the corresponding field limiting regions 26A to 26H in the corresponding first openings 44A to 44H.

The field electrode 9H formed on the outermost side may include a lead portion 52. The lead portion 52 of the field electrode 9H may be led onto the insulating layer 41 from the inside of the first opening 44H to the opposite side of the device forming region 6 (the side surface 5 side of the semiconductor layer 2).

The equipotential electrode 10 enters the second opening 45 from the upper side of the insulating layer 41. The equipotential electrode 10 is electrically connected to the channel stop region 28 in the second opening 45.

An insulating distance L between an inner peripheral edge of the equipotential electrode 10 and an outer peripheral edge of the field electrode 9H formed on the outermost side may be not less than 30 μm and not more than 60 μm. The insulating distance L may be not less than 30 μm and not more than 40 μm, not less than 40 μm and not more than 50 μm, or not less than 50 μm and not more than 60 μm.

Width of the equipotential electrode 10 may be not less than 60 μm and not more than 100 μm. The width of the equipotential electrode 10 may be not less than 60 μm and not more than 70 μm, not less than 70 μm and not more than 80 μm, not less than 80 μm and not more than 90 μm, or not less than 90 μm and not more than 100 μm. The width of the equipotential electrode 10 is about 80 μm in this embodiment.

A protective layer 55 is formed on the first main surface 3. The protective layer 55 may include resin. The protective layer 55 may include a polyimide. The protective layer 55 covers the anode electrode 8, the field electrode 9, and the equipotential electrode 10. With reference to FIG. 2, an anode pad opening 56 from which the main body portion 11 of the anode electrode 8 is exposed is formed in the protective layer 55.

Figure 5:
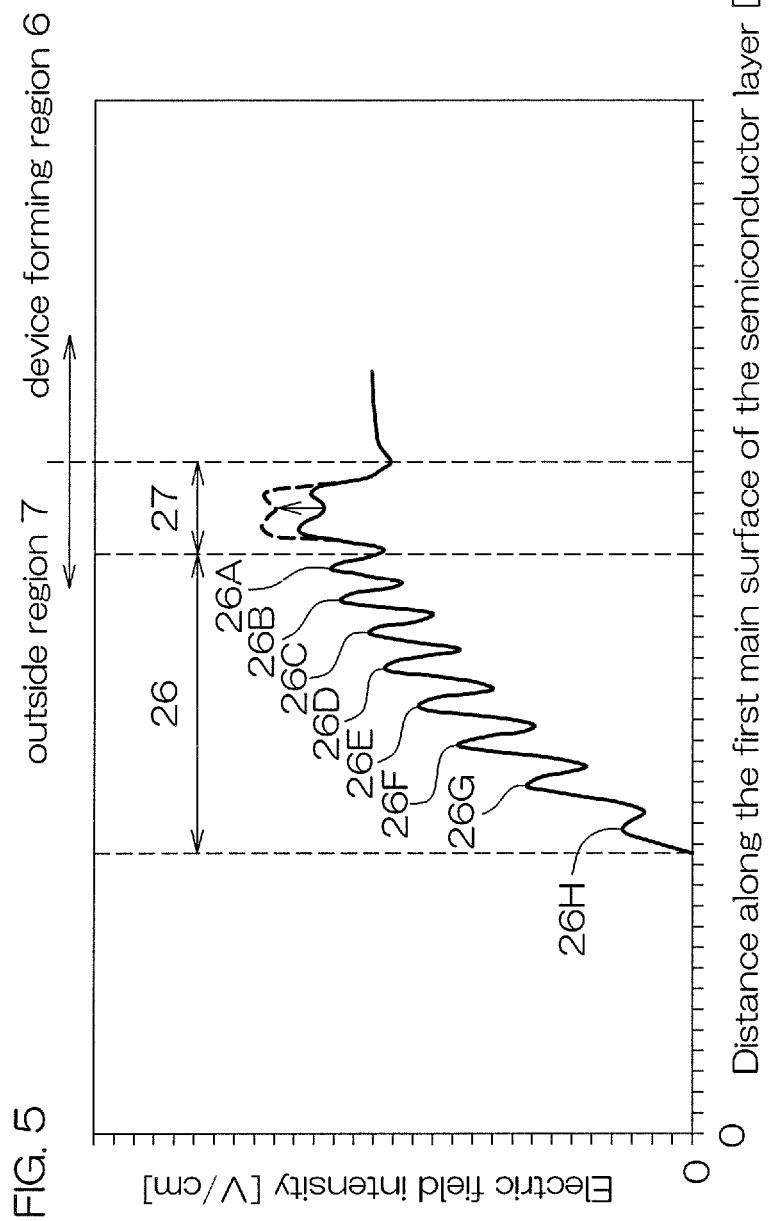
FIG. 5 is a graph showing a simulation result of electric field intensity of an outside region of the semiconductor device shown in FIG. 1.

FIG. 5 is a graph showing a simulation result of electric field intensity of the outside region 7 of the semiconductor device 1 shown in FIG. 1. In FIG. 5, the vertical axis indicates electric field intensity [V/cm], and the horizontal axis indicates a distance [μm] along the first main surface 3 of the semiconductor layer 2.

With reference to FIG. 5, the electric field intensity in the semiconductor layer 2 in the outside region 7 is lowered in the order of the well region 27 and the field limiting regions 26A to 26H. In the outside region 7, the electric field intensity of the well region 27 is the highest. The electric field intensity of the well region 27 has two maximum values.

The two maximum values represent electric field concentration on the inner peripheral edge and the outer peripheral edge of the well region 27. From this, it is understood that the well region 27 can be a starting point of breakdown. The electric field intensity for the well region 27 is increased by increasing the depth D of the well region 27 as shown by a broken line and an arrow of FIG. 5.

Figure 6:
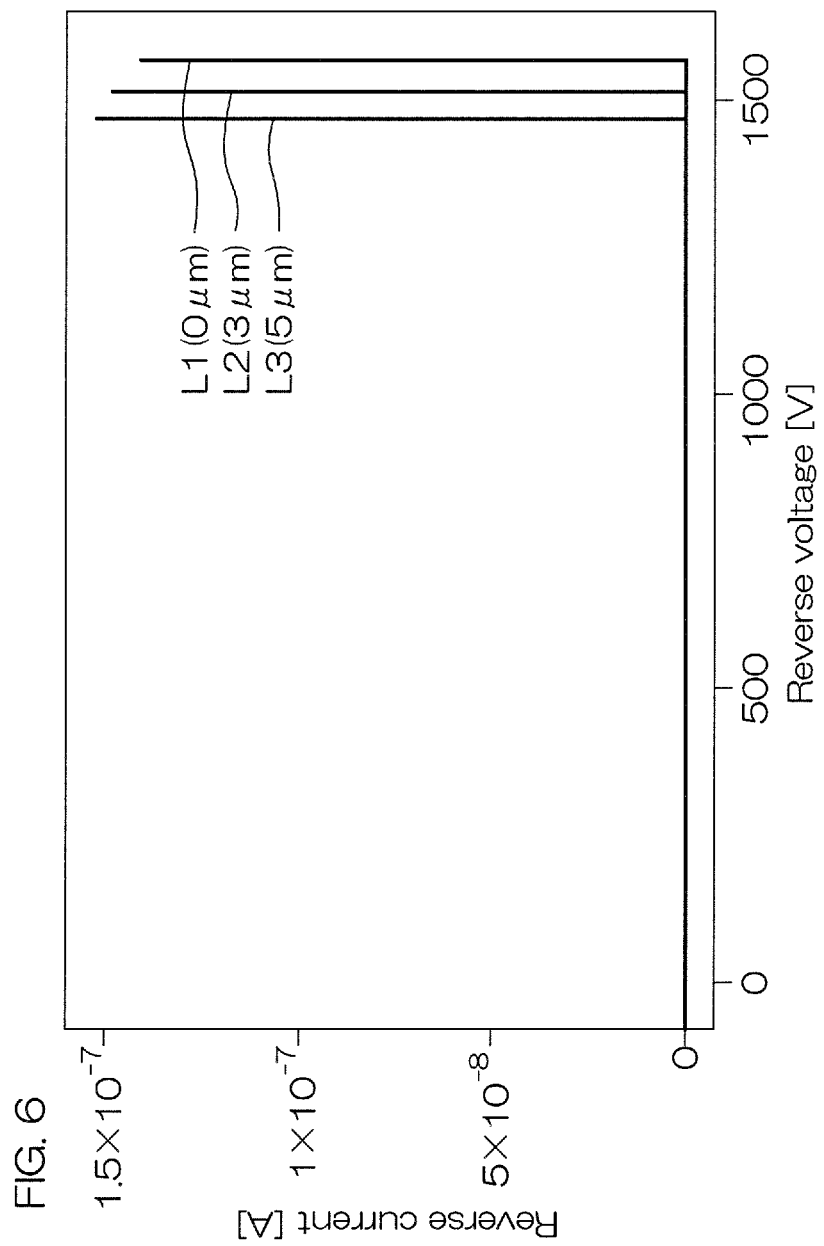
FIG. 6 is a graph showing a simulation result of a current-voltage characteristic of the semiconductor device shown in FIG. 1.

FIG. 6 is a graph showing a simulation result of a current-voltage characteristic of the semiconductor device 1 shown in FIG. 1. In FIG. 6, the vertical axis indicates a reverse current IR [A], and the horizontal axis indicates reverse voltage VR [V].

Here, the depth DT of the trench 31 is adjusted, a depth position of the well region 27 formed according to the trench 31 with respect to the first main surface 3 is adjusted, and then breakdown voltage is measured. The depth D2 of the bottom wall region 33 is about 7.5 μm in any case.

FIG. 6 shows a first characteristic L1, a second characteristic L2, and a third characteristic L3. The first characteristic L1 shows a characteristic in a case where the depth DT of the trench 31 is 0 μm, that is, no trench 31 is formed. The second characteristic L2 shows a characteristic in a case where the depth DT of the trench 31 is 3 μm. The third characteristic L3 shows a characteristic in a case where the depth DT of the trench 31 is 5 μm.

With reference to the first characteristic L1, the breakdown voltage is about 1570 V. With reference to the second characteristic L2, the breakdown voltage is about 1520 V. With reference to the third characteristic L3, the breakdown voltage is about 1470 V.

In such a manner, it is found that, when the distance between the bottom portion of the well region 27 and the second main surface 4 is reduced, the breakdown voltage is lowered. That is, it is found that, when the distance between the bottom portion of the well region 27 and the second main surface 4 is reduced, withstand voltage of the semiconductor layer 2 is lowered.

Formation of the trench 31 does not dramatically change the breakdown voltage. The formation of the trench 31 lowers the breakdown voltage within a relatively small value range. Therefore, the breakdown voltage can be finely adjusted by adjusting the depth DT of the trench 31 and adjusting the depth position of the well region 27 with respect to the first main surface 3.

As described above, with the semiconductor device 1, in addition to a design of the field limiting region 26, the depth D of the well region 27 can also be included in parameters of withstand voltage adjustment. More specifically, the well region 27 has the bottom portion positioned at the second main surface 4 side with respect to the bottom portion of the anode region 25 and the bottom portion of the field limiting region 26.

Thereby, the apparent thickness of the semiconductor layer 2 can be reduced in the region where the well region 27 is formed. Thus, the electric field intensity for the well region 27 is enhanced, so that the withstand voltage can be lowered. A lowered amount of the withstand voltage is increased as the depth D of the well region 27 is increased.

Therefore, with the semiconductor device 1, by purposely utilizing a negative effect of withstand voltage lowering due to the depth D of the well region 27, the withstand voltage increased by the field limiting region 26 can be lowered to match a target withstand voltage value. Thus, it is possible to provide the semiconductor device 1 with which the withstand voltage can be properly adjusted.

Furthermore, with the semiconductor device 1, the trench 31 is formed on the first main surface 3. The trench 31 is formed in a region between the device forming region 6 and the field limiting region 26 in the outside region 7. The well region 27 is formed in the region along the trench 31 in the surface layer portion of the first main surface 3.

With such a structure, by utilizing the depth DT of the trench 31, the well region 27 can be formed in a relatively deep region in the surface layer portion of the first main surface 3. Thereby, the distance between the bottom portion of the well region 27 and the second main surface 4 can be easily and properly adjusted. Therefore, it is possible to provide the semiconductor device 1 with which the withstand voltage can be easily and properly adjusted.

Furthermore, with the semiconductor device 1, the well region 27 encloses the device forming region 6. Thereby, the device forming region 6 can be properly protected from breakdown.

FIGS. 7A to 7M are sectional views of parts corresponding to FIG. 4, the sectional views for explaining an example of a manufacturing method of the semiconductor device 1 shown in FIG. 1.

First, with reference to FIG. 7A, the semiconductor layer 2 having the first main surface 3 and the second main surface 4 is prepared. Next, a hard mask 61 is formed on the first main surface 3 of the semiconductor layer 2. The hard mask 61 may include $SiO_2$. The hard mask 61 may be formed by thermal oxidation treatment or the CVD (Chemical Vapor Deposition) method.

Next, with reference to FIG. 7B, a resist mask 62 having a predetermined pattern is formed on the hard mask 61. The resist mask 62 has an opening 63 from which a region of the first main surface 3 where the trench 31 is to be formed is exposed.

Next, an unnecessary part of the hard mask 61 is removed by an etching method via the resist mask 62. Thereby, an opening 64 from which the region of the first main surface 3 where the trench 31 is to be formed is exposed is formed in the hard mask 61. Thereafter, the resist mask 62 is removed.

Next, with reference to FIG. 7C, an unnecessary part of the semiconductor layer 2 is removed by an etching method via the hard mask 61. The etching method may be a wet-etching method. Thereby, the trench 31 having predetermined depth is formed. Thereafter, the hard mask 61 is removed.

Next, with reference to FIG. 7D, an ion implantation mask 65 having a predetermined pattern is formed on the first main surface 3. The ion implantation mask 65 has plural openings 66 from which a region where the well region 27 and the field limiting region 26 are to be formed is exposed.

Next, p-type impurities are introduced to the surface layer portion of the first main surface 3 by an ion implantation method via the ion implantation mask 65. Thereby, the well region 27 and the field limiting region 26 are formed at the same time. In this process, the depth D1 of the side wall region 32 of the well region 27 is formed to be substantially equal to the depth DF of the field limiting regions 26A to 26H.

Thereafter, the ion implantation mask 65 is removed. The well region 27 and the field limiting region 26 may be formed separately by different ion implantation methods via different ion implantation masks 65. In this case, the depth D1 of the side wall region 32 of the well region 27 is formed to be different from the depth DF of the field limiting regions 26A to 26H.

Although not shown, the channel stop region 28 is also formed in the surface layer portion of the first main surface 3. In this process, first, an ion implantation mask (not shown) having a predetermined pattern is formed on the first main surface 3. The ion implantation mask (not shown) has an opening (not shown) from which a region where the channel stop region 28 is to be formed is exposed.

Next, n-type impurities are introduced to the surface layer portion of the first main surface 3 by an ion implantation method via the ion implantation mask (not shown). Thereby, the channel stop region 28 is formed. Thereafter, the ion implantation mask (not shown) is removed.

Figure 7E:
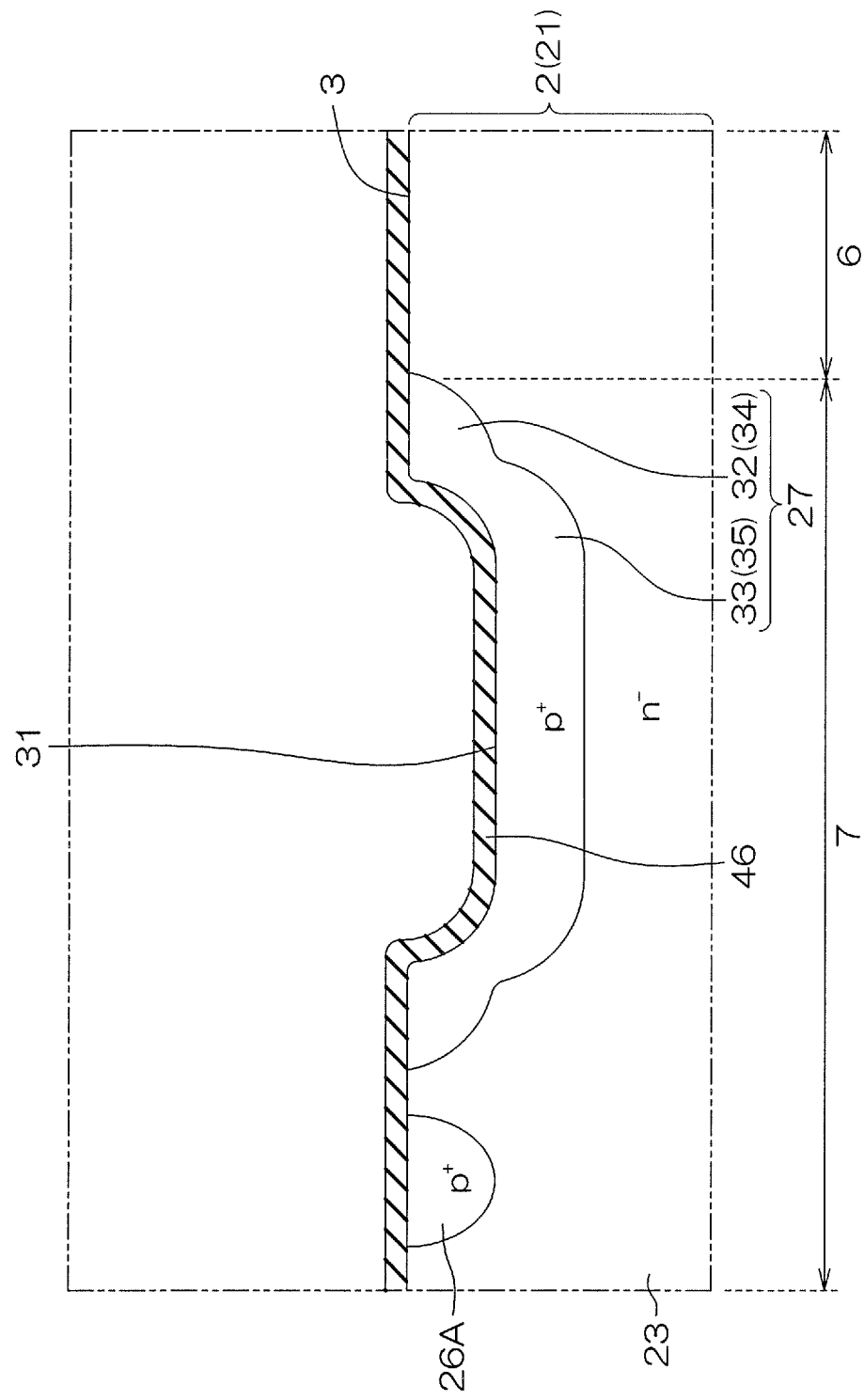

Next, with reference to FIG. 7E, the first insulating film 46 is formed on the first main surface 3. The first insulating film 46 may include an $SiO_2$ film. The first insulating film 46 may be formed by the thermal oxidation treatment or the CVD method.

Next, with reference to FIG. 7F, a resist mask 67 having a predetermined pattern is formed on the first insulating film 46. The resist mask 67 has an opening 68 from which a region of the first main surface 3 where the anode region 25 is to be formed is exposed. Next, an unnecessary part of the first insulating film 46 is removed by an etching method via the resist mask 67. Thereafter, the resist mask 67 is removed.

Figure 7G:
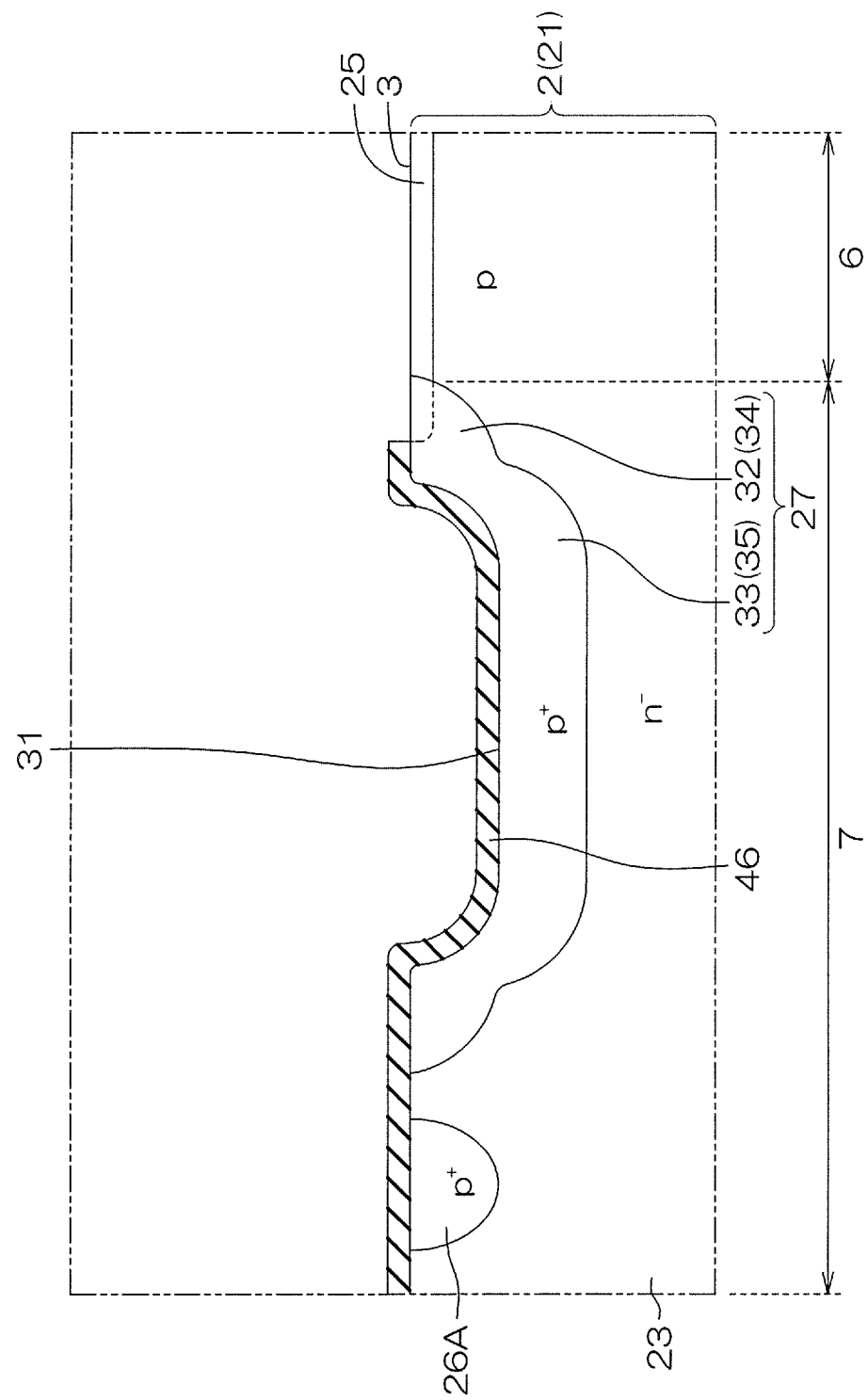

Next, with reference to FIG. 7G, p-type impurities are introduced to the surface layer portion of the first main surface 3 by an ion implantation method via the first insulating film 46. Thereby, the anode region 25 is formed.

Figure 7H:
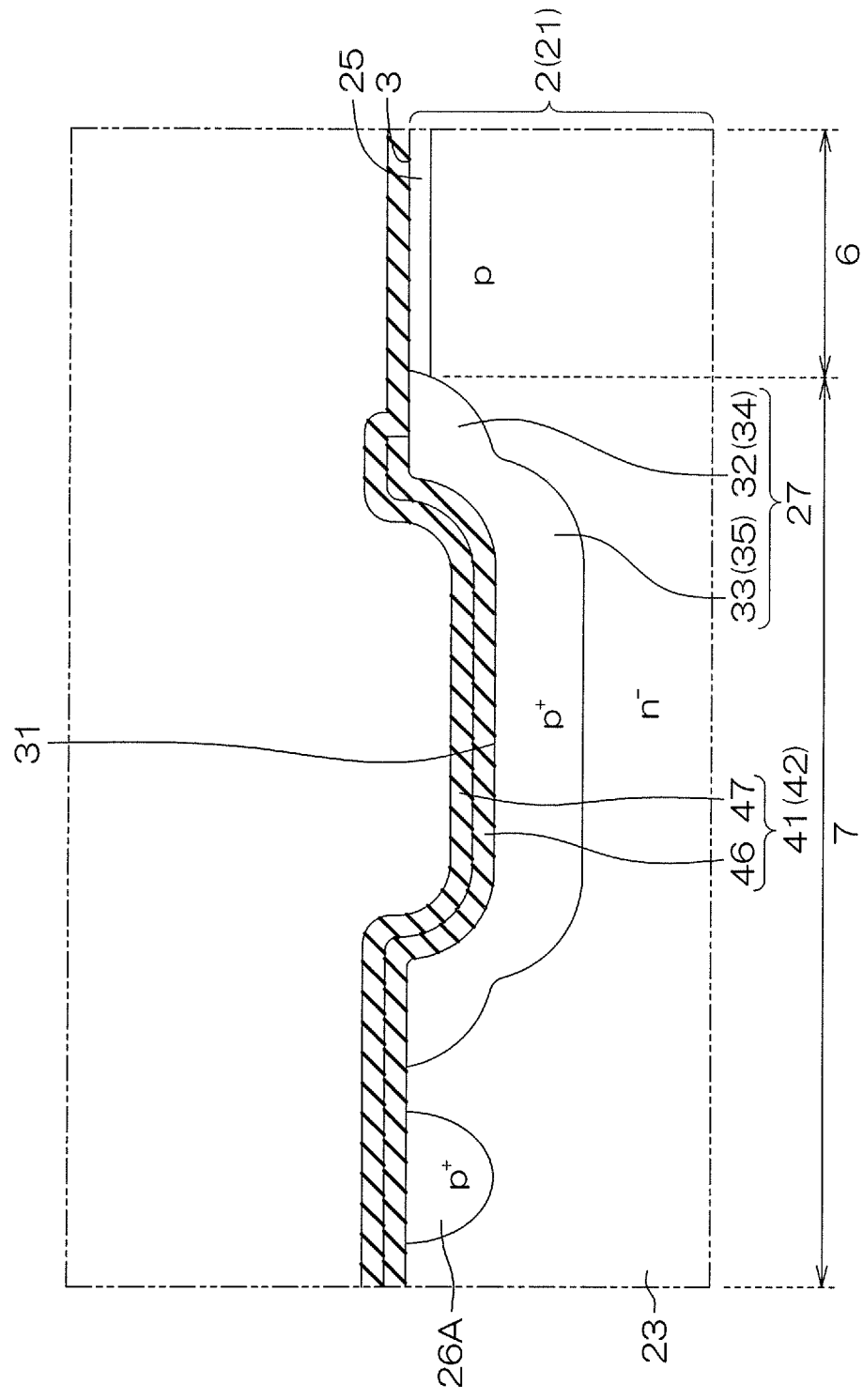

Next, with reference to FIG. 7H, the second insulating film 47 is formed on the first main surface 3 so as to cover the first insulating film 46. The second insulating film 47 may include an $SiO_2$ film having a different property from the first insulating film 46. The second insulating film 47 may include a PSG film and/or a BPSG film. The second insulating film 47 may be formed by the CVD method.

Figure 7I:
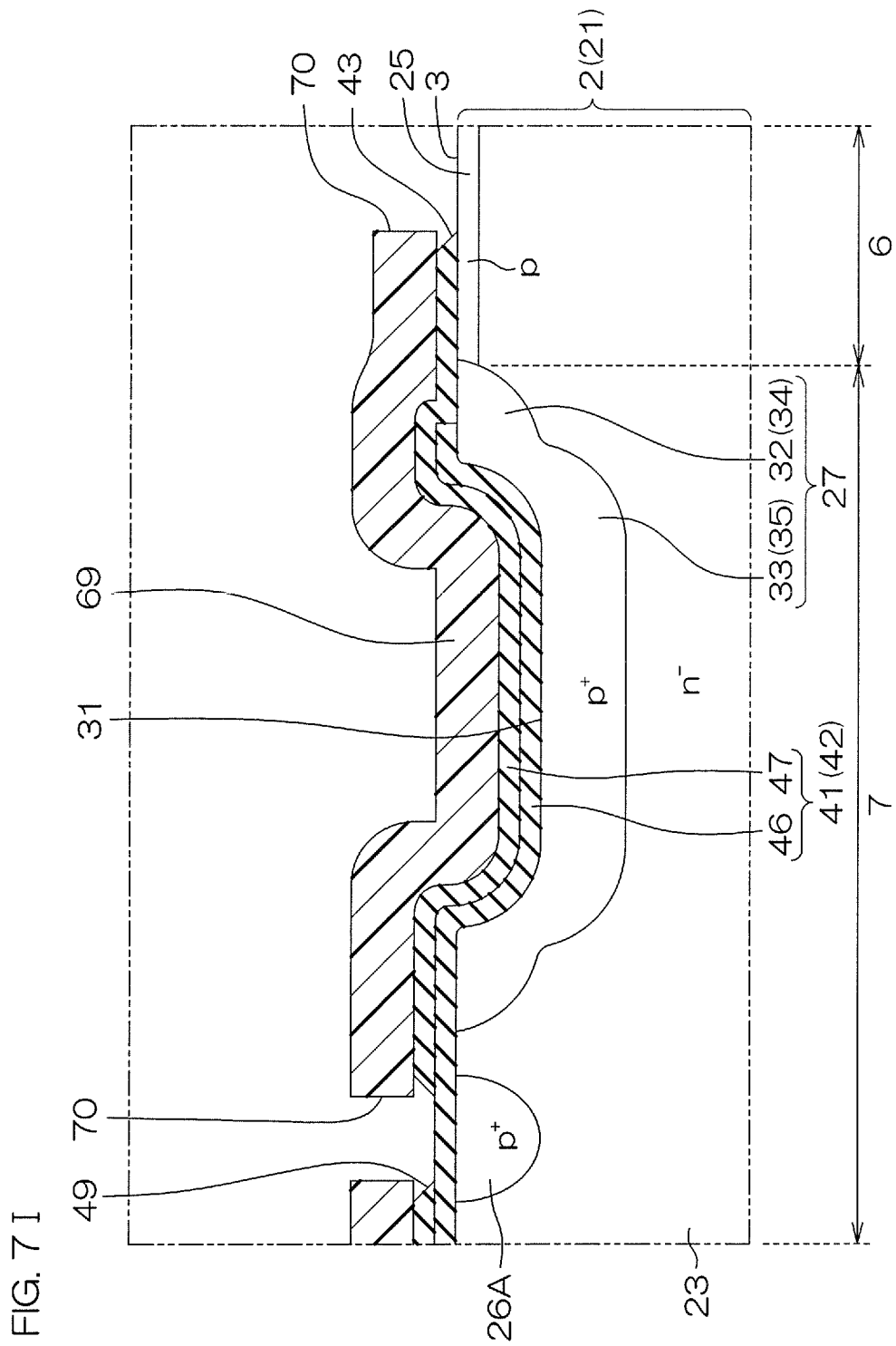

Next, with reference to FIG. 7I, a resist mask 69 having a predetermined pattern is formed on the second insulating film 47. The resist mask 69 has plural openings 70 from which regions where the anode opening 43, the second contact holes 49 of the first openings 44A to 44H, and the second contact hole 49 of the second opening 45 are to be formed are exposed.

Next, an unnecessary part of the second insulating film 47 is removed by an etching method via the resist mask 69. The etching method may be a wet-etching method. Thereby, the anode opening 43, the second contact holes 49 of the first openings 44A to 44H, and the second contact hole 49 of the second opening 45 are formed. Thereafter, the resist mask 69 is removed.

Figure 7J:
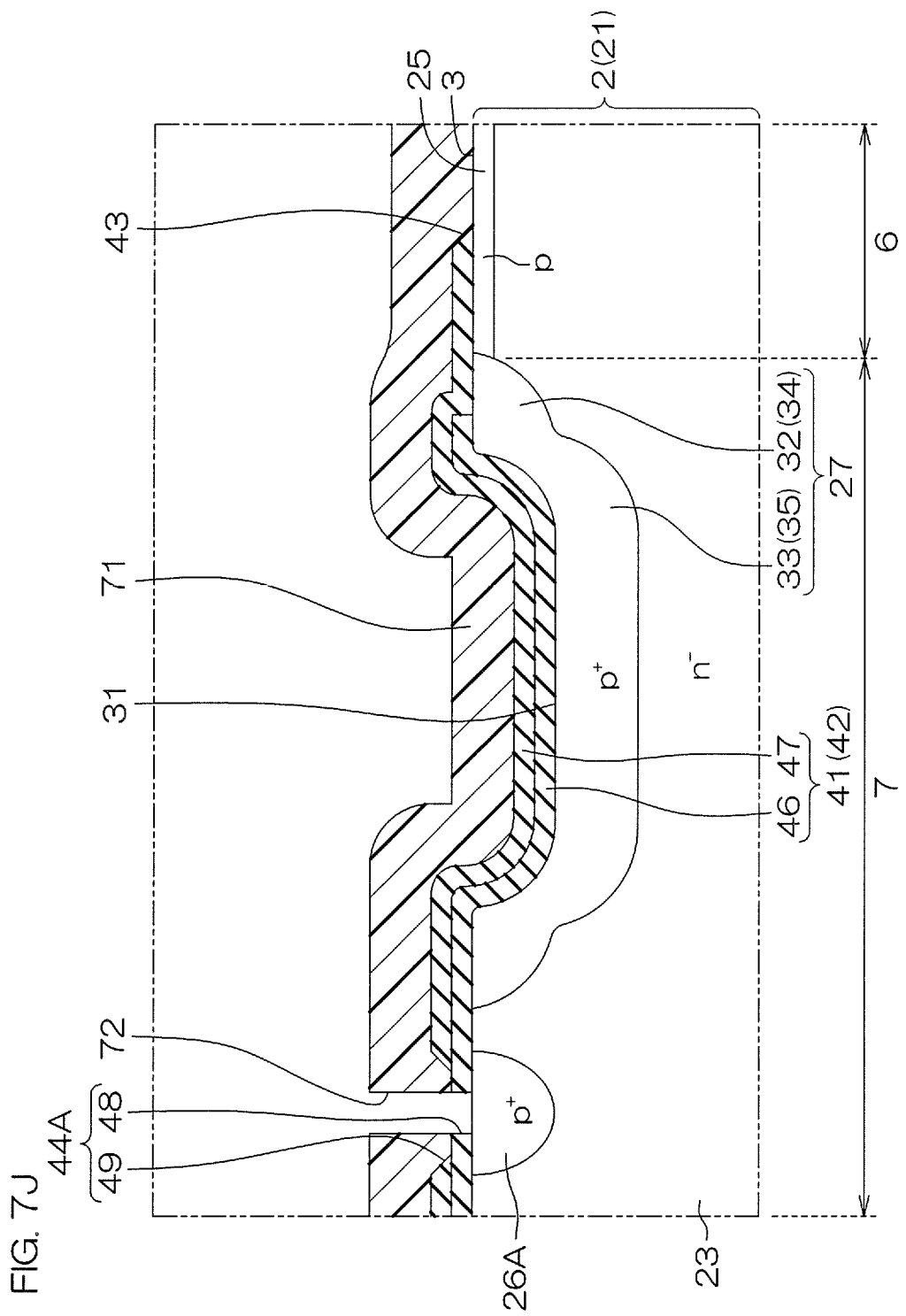

Next, with reference to FIG. 7J, a resist mask 71 having a predetermined pattern is formed on the second insulating film 47. The resist mask 71 has plural openings 72 from which regions where the first contact holes 48 of the first openings 44A to 44H and the first contact hole 48 of the second opening 45 are to be formed are exposed.

Next, an unnecessary part of the first insulating film 46 is removed by an etching method via the resist mask 71. The etching method may be a dry-etching method. Thereby, the first contact holes 48 of the first openings 44A to 44H and the first contact hole 48 of the second opening 45 are formed. Thereafter, the resist mask 71 is removed.

Figure 7K:
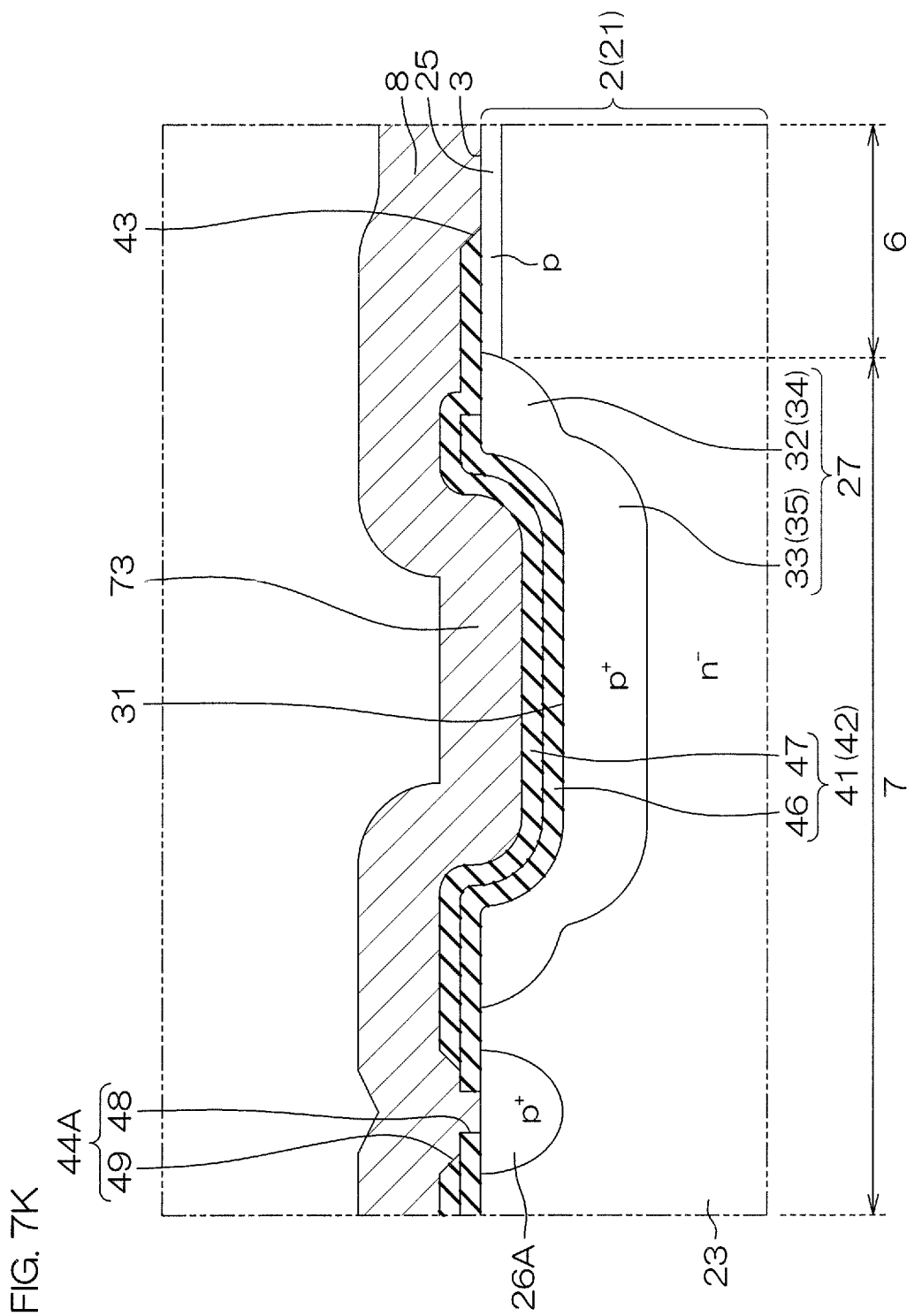

Next, with reference to FIG. 7K, a base electrode layer 73 serving as a base of the anode electrode 8, the field electrode 9, and the equipotential electrode 10 is formed.

Figure 7L:
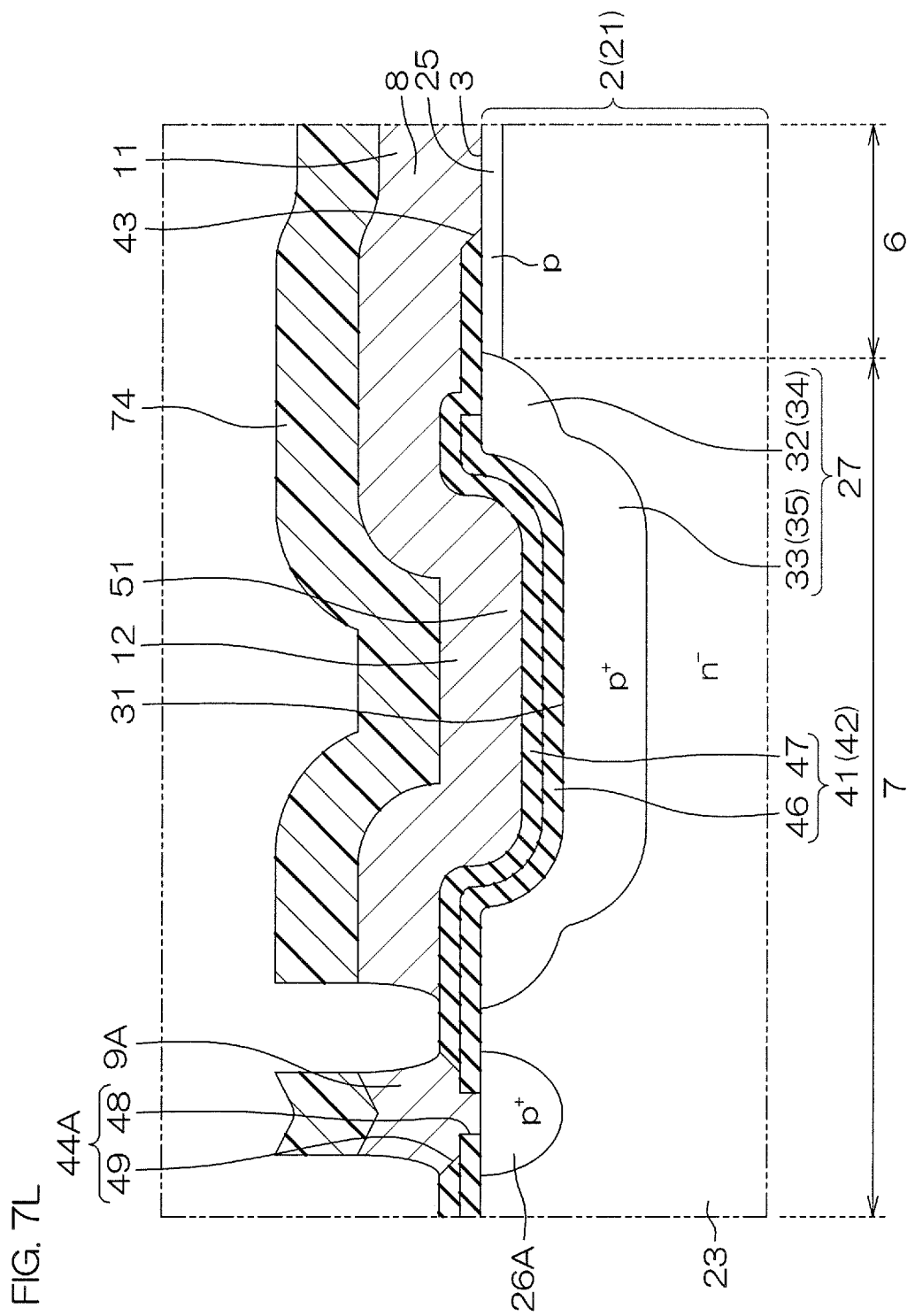

Next, with reference to FIG. 7L, a resist mask 74 having a predetermined pattern is formed on the base electrode layer 73. The resist mask 74 covers a region of the base electrode layer 73 where the anode electrode 8, the field electrode 9, and the equipotential electrode 10 are to be formed. Next, an unnecessary part of the base electrode layer 73 is removed by an etching method via the resist mask 74. Thereby, the base electrode layer 73 is divided into the anode electrode 8, the field electrode 9, and the equipotential electrode 10. Thereafter, the resist mask 74 is removed.

Figure 7M:
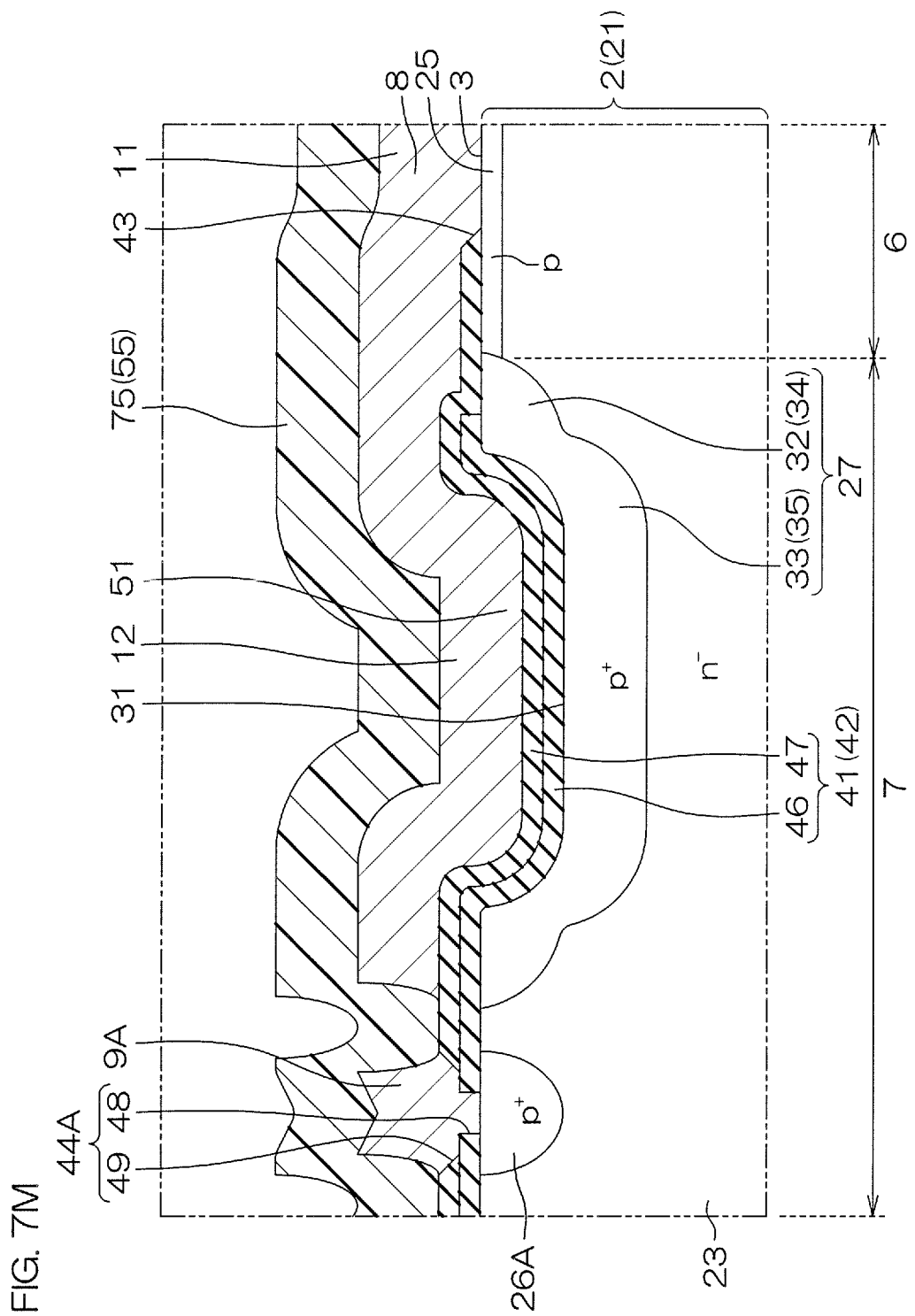

Next, with reference to FIG. 7M, photosensitive resin 75 serving as a base of the protective layer 55 is applied onto the first main surface 3. The photosensitive resin 75 may include a polyimide. Next, the photosensitive resin 75 is selectively exposed and developed. Thereby, the protective layer 55 having the anode pad opening 56 from which the main body portion 11 of the anode electrode 8 is exposed is formed. Through processes including the above processes, the semiconductor device 1 is manufactured.

Figure 8:
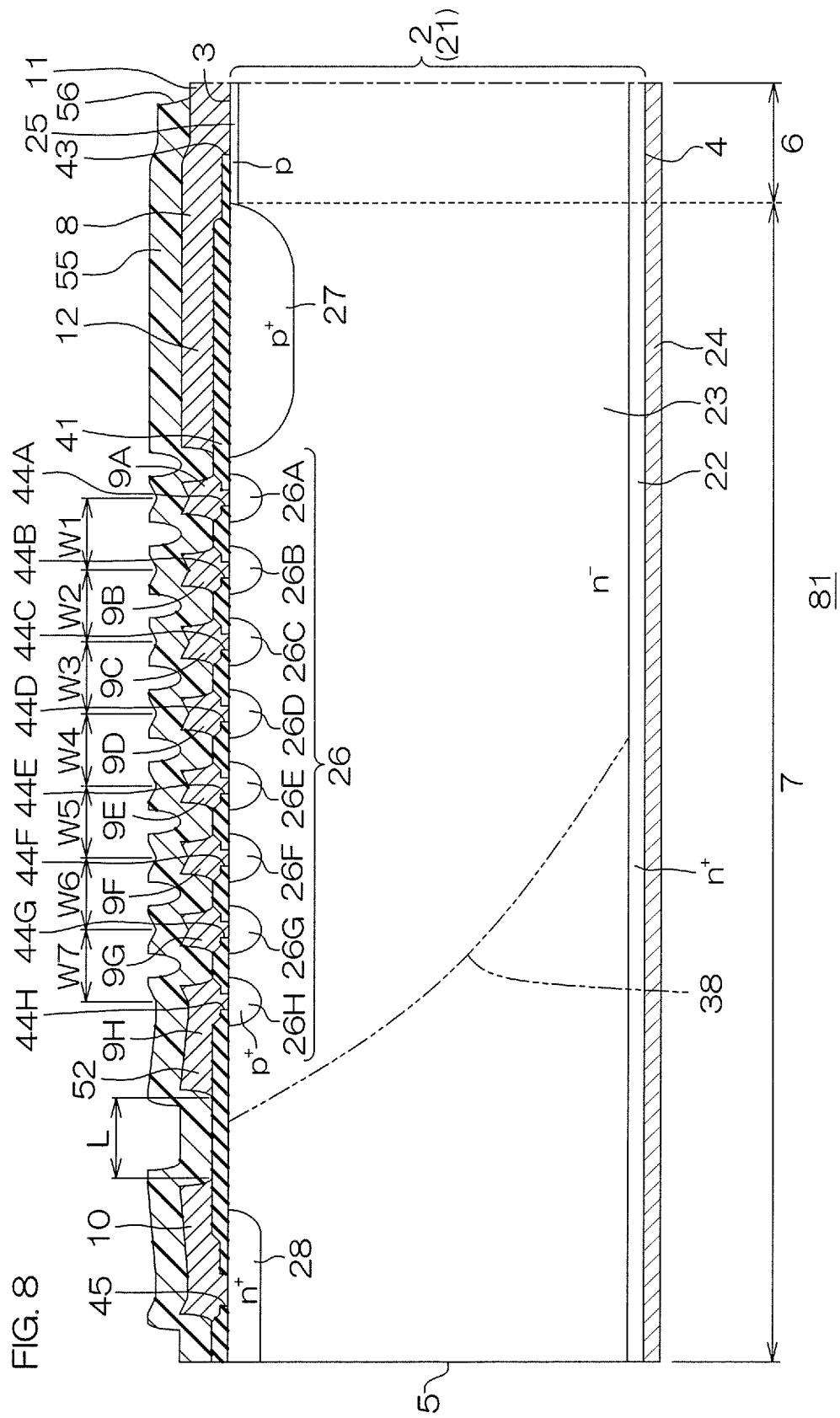
FIG. 8 is a sectional view of a part corresponding to FIG. 2, the sectional view for explaining a structure of a semiconductor device according to a second preferred embodiment of the present invention.

FIG. 8 is a sectional view of a part corresponding to FIG. 2, the sectional view for explaining a structure of a semiconductor device 81 according to a second preferred embodiment of the present invention. Hereinafter, structures corresponding to the structures described for the semiconductor device 1 will be given the same reference signs and description thereof will be omitted.

In the semiconductor device 81, no trench 31 is formed on a first main surface 3. In the semiconductor device 81, a well region 27 has no side wall region 32 and no bottom wall region 33. However, a bottom portion of the well region 27 is positioned at the second main surface 4 side with respect to a bottom portion of an anode region 25 and a bottom portion of a field limiting region 26 regarding the thickness direction of a semiconductor layer 2.

As described above, with the semiconductor device 81, except for the withstand voltage adjusting effect by the depth DT of the trench 31, similar effects to the effects described for the semiconductor device 1 can be exerted.

Figure 9:
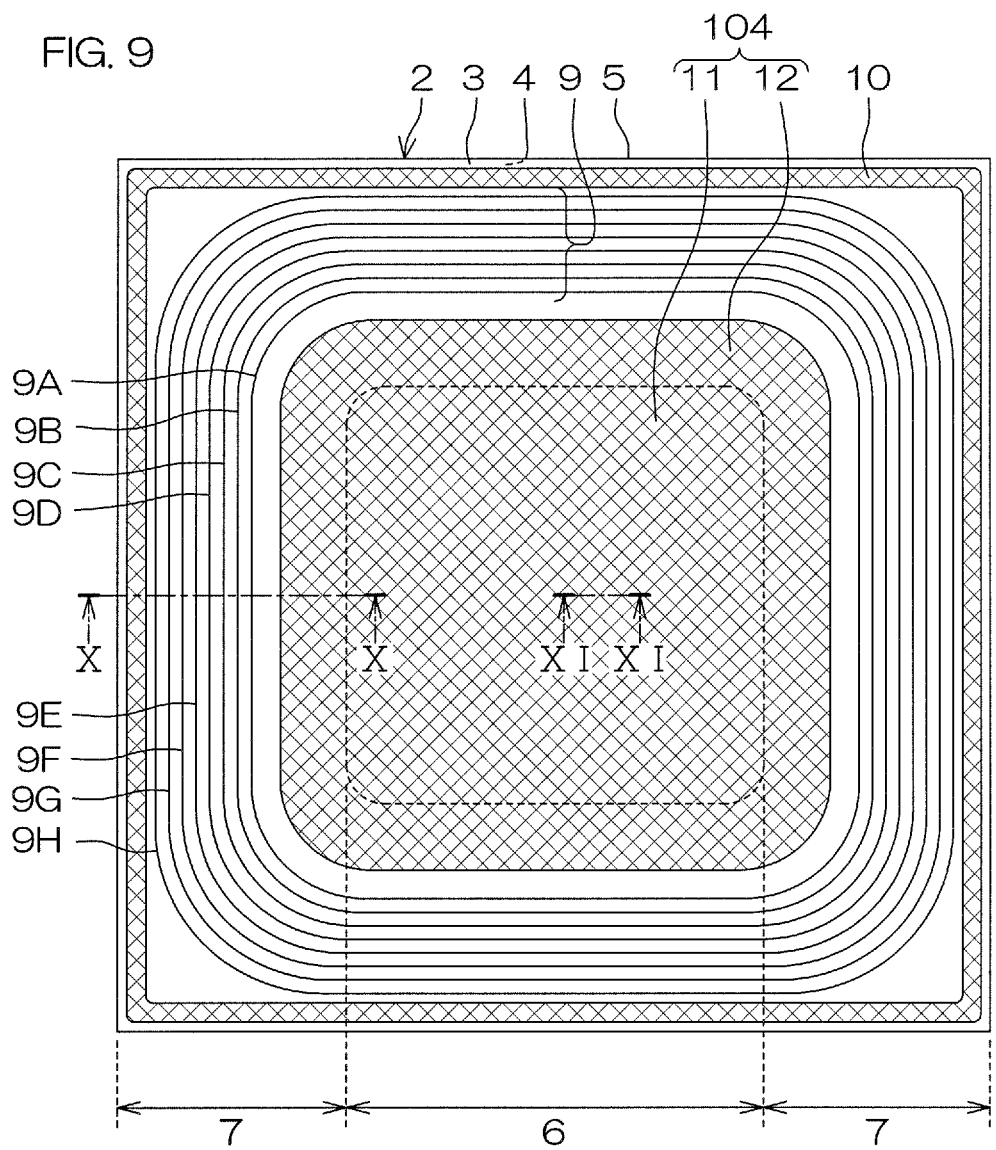
FIG. 9 is a plan view showing a semiconductor device according to a third preferred embodiment of the present invention.
Figure 10:
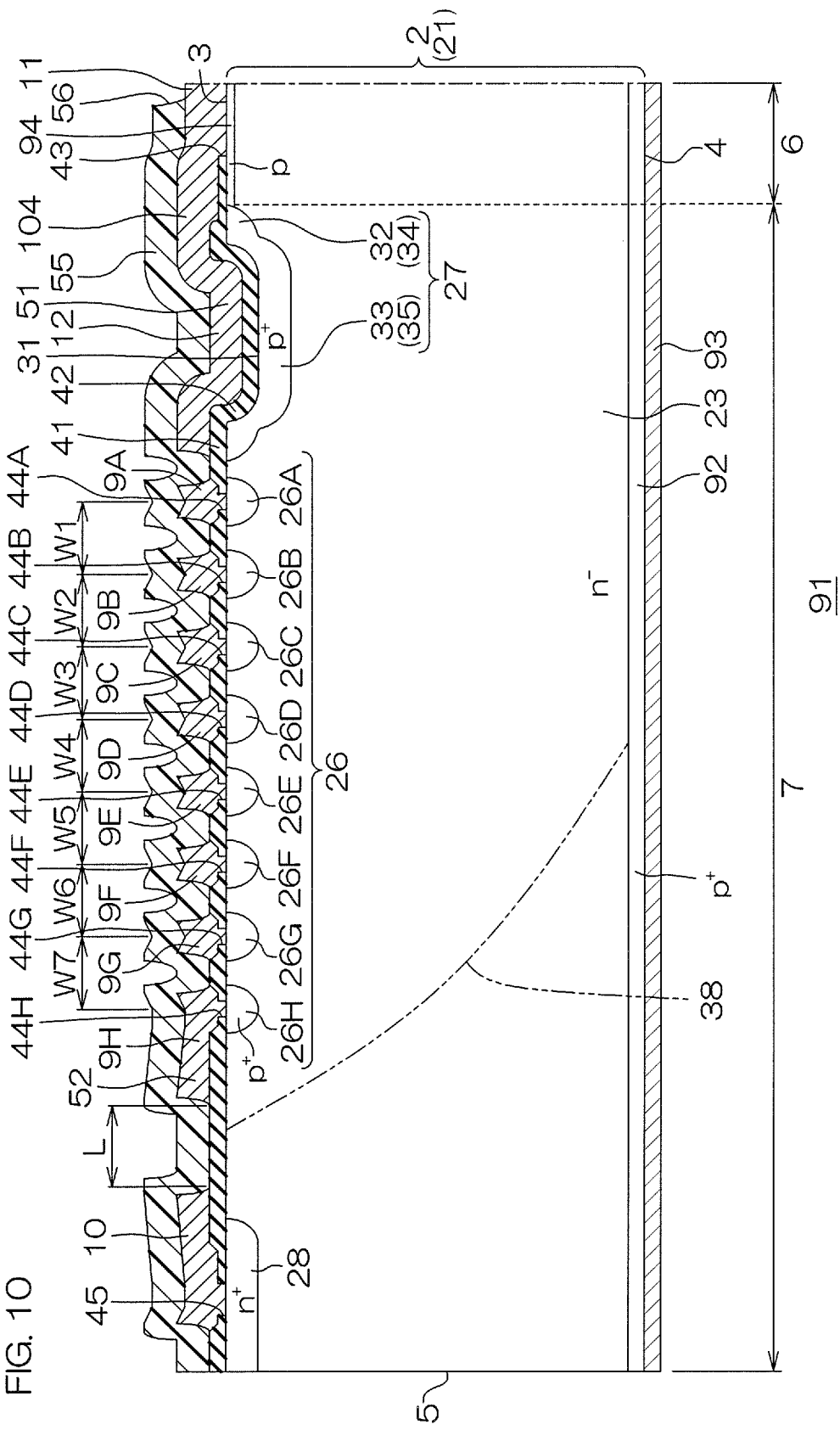
FIG. 10 is a sectional view taken along line X-X shown in FIG. 9.
Figure 11:
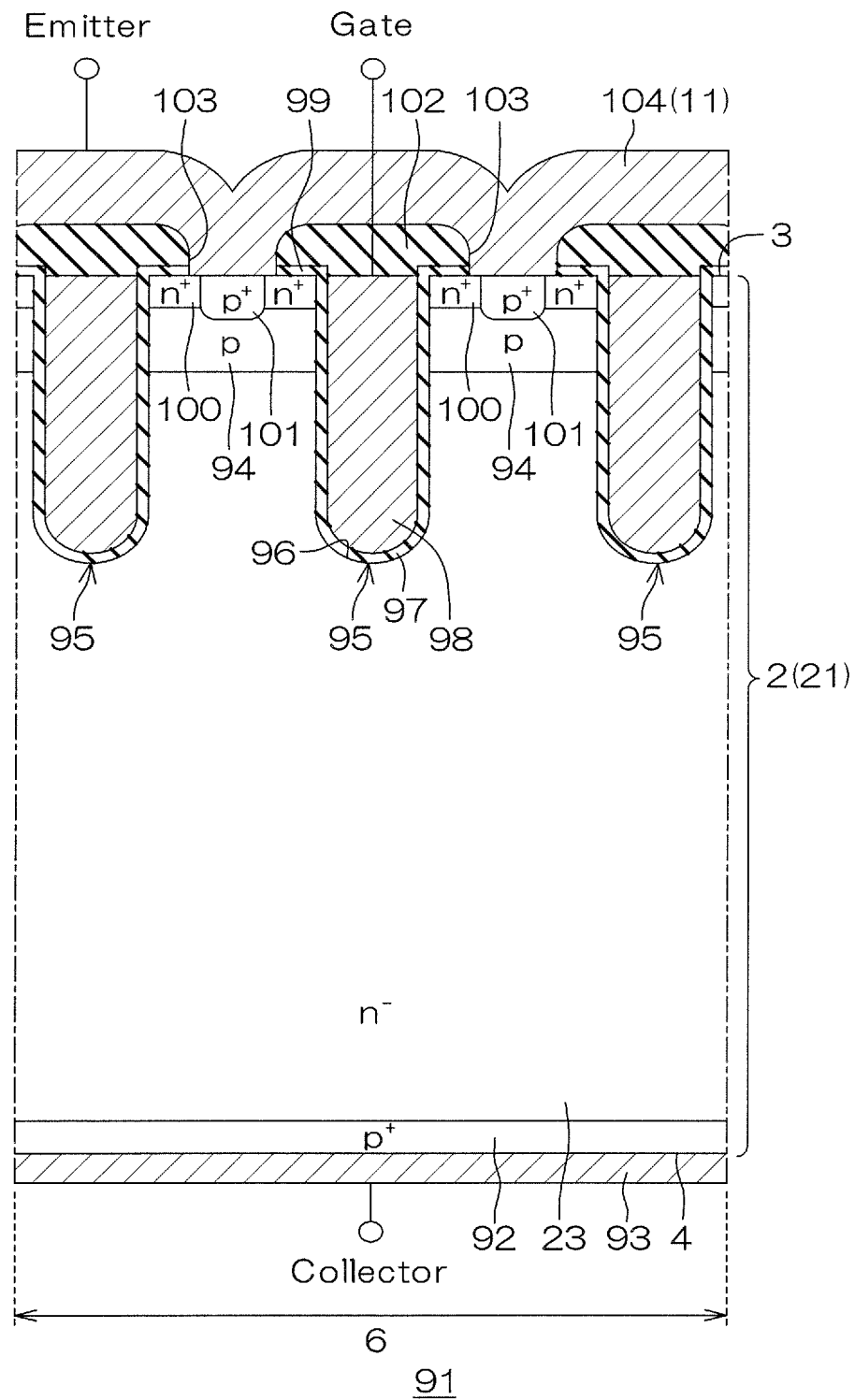
FIG. 11 is a sectional view taken along line XI-XI shown in FIG. 9.

FIG. 9 is a plan view showing a semiconductor device 91 according to a third preferred embodiment of the present invention. FIG. 10 is a sectional view taken along line X-X shown in FIG. 9. FIG. 11 is a sectional view taken along line XI-XI shown in FIG. 9. Hereinafter, structures corresponding to the structures described for the semiconductor device 1 will be given the same reference signs and description thereof will be omitted.

With reference to FIGS. 9 to 11, in a device forming region 6 in the semiconductor device 91, an IGBT (Insulated Gate Bipolar Transistor) is formed in place of the pn junction diode.

More specifically, in a surface layer portion of a second main surface 4 of a semiconductor layer 2, a $p^+$-type collector region 92 is formed in place of the high concentration region 22. On the second main surface 4, a collector electrode 93 is formed in place of the cathode electrode 24. The collector electrode 93 forms an ohmic junction with the collector region 92.

In a surface layer portion of a first main surface 3 of the semiconductor layer 2 in the device forming region 6, a p-type body region 94 is formed in place of the anode region 25. The body region 94 is formed in a central portion of the semiconductor layer 2 while being spaced from a side surface 5 of the semiconductor layer 2 to an inner region in the plan view. The body region 94 may be set in a square shape having four sides parallel to the side surface 5 in the plan view. The body region 94 defines the device forming region 6.

Depth of the body region 94 may be not less than 1.5 μm and not more than 3.5 μm. The depth of the body region 94 is a distance between the first main surface 3 and a bottom portion of the body region 94. The depth of the body region 94 may be not less than 1.5 μm and not more than 2.0 μm, not less than 2.0 μm and not more than 2.5 μm, not less than 2.5 μm and not more than 3.0 μm, or not less than 3.0 μm and not more than 3.5 μm. The depth of the body region 94 may be about 2.0 μm.

Relationships between the field limiting region 26 and the well region 27, and the body region 94 are similar to the relationships between the field limiting region 26 and the well region 27, and the anode region 25. Thus, specific description will be omitted.

With reference to FIG. 11, trench gate structures 95 are formed on the first main surface 3 in the device forming region 6. In this embodiment, the plural trench gate structures 95 are formed. The plural trench gate structures 95 may be formed in a stripe shape extending along the same directions in the plan view.

Each of the trench gate structures 95 includes a gate trench 96, a gate insulating layer 97, and a gate electrode layer 98. The gate trench 96 passes through the body region 94. The gate trench 96 has a bottom wall reaching the drift region 23.

A side wall of the gate trench 96 is formed to be substantially perpendicular to the first main surface 3. The gate trench 96 may be formed in a tapered shape in which an opening area is larger than a bottom area. The bottom wall of the gate trench 96 may be formed in a projected and curved shape toward the outside. The bottom wall of the gate trench 96 may be formed to be parallel to the first main surface 3.

The gate insulating layer 97 is formed in a film shape along an inner wall of the gate trench 96. The gate insulating layer 97 defines a recessed space in the gate trench 96. Outside the gate trench 96, the gate insulating layer 97 continues to a surface insulating layer 99 that covers the first main surface 3 in the device forming region 6. The gate electrode layer 98 is embedded in the gate trench 96 while sandwiching the gate insulating layer 97.

The body region 94 is shared by the trench gate structure 95 on one side and the trench gate structure 95 on the other side between the two adjacent trench gate structures 95. In a surface layer portion of the body region 94, an $n^+$-type emitter region 100 and a $p^+$-type contact region 101 are formed.

The emitter region 100 is formed along the side wall of the gate trench 96 in the surface layer portion of the body region 94. The contact region 101 is formed in the surface layer portion of the body region 94 while being spaced from the gate trench 96. In this embodiment, the contact region 101 is formed in the surface layer portion of the body region 94 in the plan view. The contact region 101 is electrically connected to the body region 94.

The emitter region 100, the body region 94, and the drift region 23 are formed in this order from the first main surface 3 side to the second main surface 4 side of the semiconductor layer 2 at the side of each trench gate structure 95. A region of the body region 94 between the emitter region 100 and the drift region 23 is a channel region of the IGBT.

An interlayer insulating layer 102 is formed on the first main surface 3 in the device forming region 6. The interlayer insulating layer 102 has a contact opening 103 from which the emitter region 100 and the contact region 101 are exposed.

On the first main surface 3, an emitter electrode 104 (main surface electrode) is formed in place of the anode electrode 8. The emitter electrode 104 is shown by cross-hatching in FIG. 9. The emitter electrode 104 enters the contact opening 103 from the upper side of the interlayer insulating layer 102.

The emitter electrode 104 is electrically connected to the emitter region 100 and the contact region 101 in the contact opening 103. The other structures of the emitter electrode 104 are substantially similar to those of the anode electrode 8 described above. Thus, specific description will be omitted.

As described above, with the structure in which the IGBT is provided in place of the pn junction diode as in the semiconductor device 91, similar effects to the effects described for the semiconductor device 1 can also be exerted. As a matter of course, the structure of the semiconductor device 81 can also be applied to the semiconductor device 91.

Figure 12:
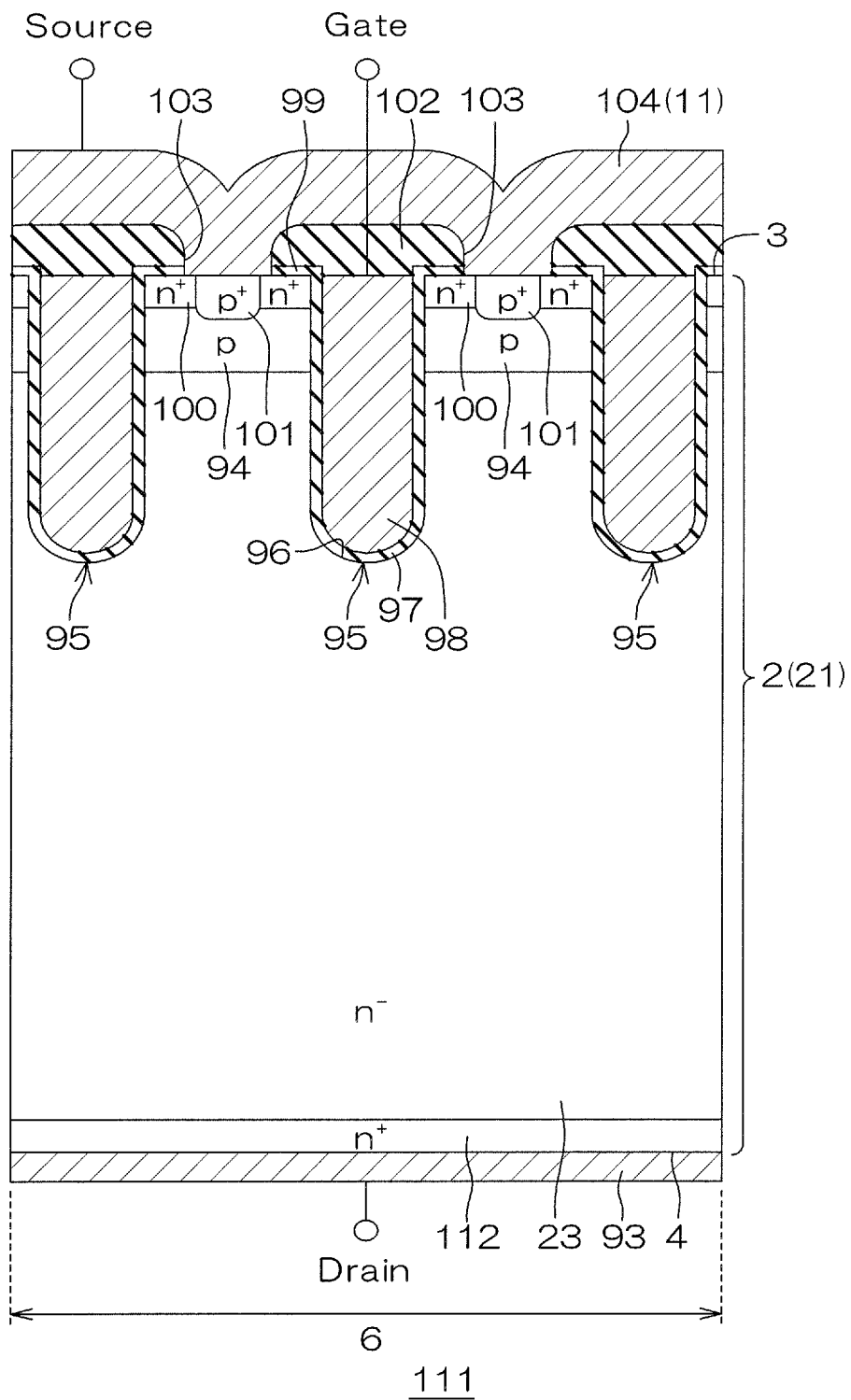
FIG. 12 is a sectional view of a part corresponding to FIG. 11, the sectional view showing a semiconductor device according to a fourth preferred embodiment of the present invention.

FIG. 12 is a sectional view of a part corresponding to FIG. 11, the sectional view showing a semiconductor device 111 according to a fourth preferred embodiment of the present invention. Hereinafter, structures corresponding to the structures described for the semiconductor device 91 will be given the same reference signs and description thereof will be omitted.

In a device forming region 6 in the semiconductor device 111, a MISFET (Metal Insulator Semiconductor Field Effect Transistor) is formed in place of the IGBT. More specifically, in the semiconductor device 111, an $n^+$-type drain region 112 is formed in place of the collector region 92 in a surface layer portion of a second main surface 4 of a semiconductor layer 2.

In a case of such a mode, an "emitter" of the IGBT is read as a "source" of the MISFET. A "collector" of the IGBT is read as a "drain" of the MISFET.

As described above, with the structure in which the MISFET is provided in place of the IGBT as in the semiconductor device 111, similar effects to the effects described for the semiconductor device 1 can also be exerted. As a matter of course, the structure of the semiconductor device 81 can also be applied to the semiconductor device 111.

Figure 13:
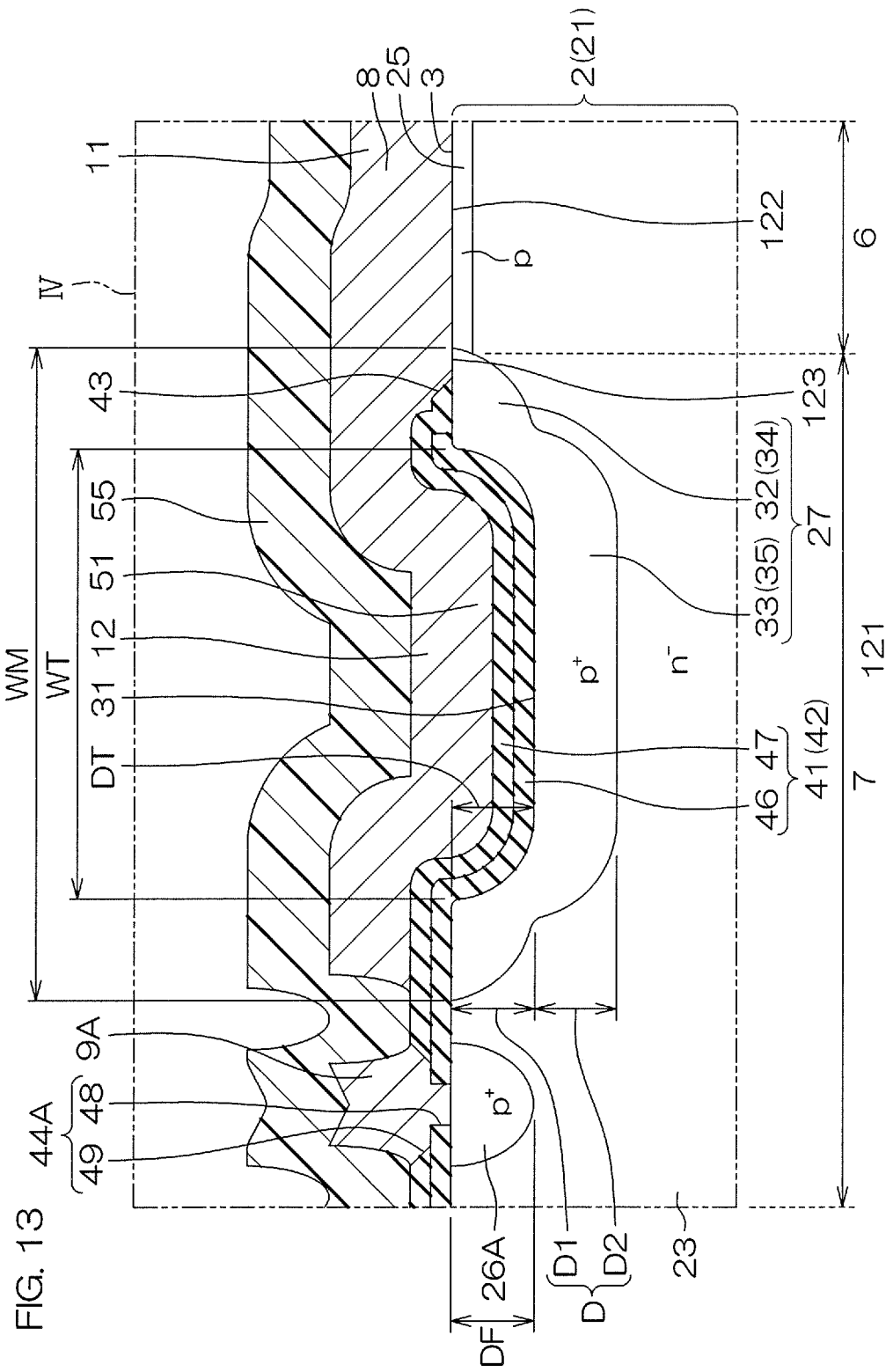
FIG. 13 is a sectional view of a part corresponding to FIG. 4, the sectional view showing a semiconductor device according to a fifth preferred embodiment of the present invention.

FIG. 13 is a sectional view of a part corresponding to FIG. 4, the sectional view showing a semiconductor device 121 according to a fifth preferred embodiment of the present invention. Hereinafter, structures corresponding to the structures described for the semiconductor device 1 will be given the same reference signs and description thereof will be omitted.

In the semiconductor device 1, only the anode region 25 is exposed from the anode opening 43. Meanwhile, in the semiconductor device 121, the anode region 25 and the well region 27 are exposed from the anode opening 43.

More specifically, the end portion of the insulating layer 41 (second insulating film 47) on the device forming region 6 side is arranged in a region immediately above the side wall region 32 of the well region 27 on the first main surface 3. The anode electrode 8 is connected to the anode region 25 and the well region 27 in the anode opening 43.

That is, the main body portion 11 of the anode electrode 8 includes a first connection portion 122 connected to the anode region 25 and a second connection portion 123 connected to the well region 27. More specifically, the second connection portion 123 of the anode electrode 8 is connected to the side wall region 32 of the well region 27.

As described above, with the semiconductor device 121, similar effects to the effects described for the semiconductor device 1 can also be exerted. Furthermore, with the semiconductor device 121, the anode electrode 8 includes the first connection portion 122 connected to the anode region 25 and the second connection portion 123 connected to the well region 27.

Therefore, at the time of ON/OFF actions, a current from the anode region 25 can directly flow into the anode electrode 8, and a current from the second connection portion 123 can also directly flow into the anode electrode 8.

Thereby, an increase in current density can be suppressed in a border region between the anode region 25 and the well region 27 where the current flowing through the well region 27 and the current flowing through the anode region 25 join together. As a result, a temperature increase can be suppressed in the border region between the anode region 25 and the well region 27. Thus, breakdown tolerance can be improved.

The structure of the semiconductor device 121 can also be applied to the semiconductor device 81 and the semiconductor device 111 described above. For example, in a case where the structure of the semiconductor device 121 is applied to the semiconductor device 81, the emitter electrode 104 structurally includes a first connection portion 122 connected to the emitter region 100 and a second connection portion 123 connected to the well region 27.

As described above, the preferred embodiments of the present invention are described. However, the present invention can be implemented in other modes.

In the above preferred embodiments, the example in which the eight field limiting regions 26A to 26H are formed is described. However, one or two or more (for example, not less than two and not more than twenty-five) field limiting regions 26 may be formed.

In the first preferred embodiment, the second preferred embodiment, and the fourth preferred embodiment described above, the semiconductor layer 2 may have a laminated structure including, in place of the semiconductor substrate 21, an $n^+$-type semiconductor substrate, and an $n^-$-type epitaxial layer formed on the $n^+$-type semiconductor substrate. In this case, the $n^+$-type semiconductor substrate corresponds to the high concentration region 22, and the $n^-$-type epitaxial layer corresponds to the drift region 23.

In the third preferred embodiment described above, the semiconductor layer 2 may have a laminated structure including, in place of the semiconductor substrate 21, a $p^+$-type semiconductor substrate, and an $n^-$-type epitaxial layer formed on the $p^+$-type semiconductor substrate. In this case, the $p^+$-type semiconductor substrate corresponds to the collector region 92, and the $n^-$-type epitaxial layer corresponds to the drift region 23.

In the above preferred embodiments, an arrangement in which the conductivity types of the semiconductor parts are reversed may be adopted. That is, the part of p-type may be an n-type, and the part of n-type may be a p-type.

This description does not restrict any combination modes between the characteristics shown in the first to fifth preferred embodiments. The first to fifth preferred embodiments can be combined between the preferred embodiments in an arbitrary mode and in an arbitrary form. That is, any mode in which the characteristics shown in the first to fifth preferred embodiments are combined in an arbitrary mode and in an arbitrary form may be adopted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An IGBT (Insulated Gate Bipolar Transistor) semiconductor device comprising:
  a semiconductor layer of a first conductivity type having a first main surface on one side and a second main surface on the other side, the semiconductor layer in which a device region and an outside region outside the device region are set on the first main surface;
  an impurity region of a second conductivity type formed in a surface layer portion of the first main surface in the device;
  a field limiting region group including a plurality of field limiting regions of the second conductivity type formed in the surface layer portion of the first main surface in the outside region while being spaced from the impurity region;
  a well region of a second conductivity type formed in a region between the impurity region and the field limiting region in the surface layer portion of the first main surface in the outside region, the well region having a bottom portion positioned at the second main surface side with respect to a bottom portion of the impurity region and bottom portions of the plurality of field limiting regions;
  an insulating layer covering the field limiting region;
  a field electrode arranged on the insulating layer such as to face the field limiting region across the insulating layer and formed in an electrically floating state;

wherein the plurality of field limit regions are arranged at intervals from each other such that distances between adjacent pairs of field limit regions become greater as distances from the device region become greater, and the field electrode includes a curved side wall that is obliquely inclined with respect to a surface of the insulating film and whose center of curvature is located at the surface side of the insulating film.

2. The IGBT semiconductor device according to claim 1, wherein the bottom portions of the plurality of field limiting regions are positioned at the second main surface side with respect to the bottom portion of the impurity region.

3. The IGBT semiconductor device according to claim 1, wherein the plurality of field limiting regions extends along a peripheral edge of the device region.

4. The IGBT semiconductor device according to claim 1, wherein the plurality of field limiting regions enclose the device region.

5. The IGBT semiconductor device according to claim 1, wherein a depth of each of the field limiting regions is not less than 5 μm and not more than 10 μm.

6. The IGBT semiconductor device according to claim 1, wherein a width of each of the field limiting regions is not less than 10 μm and not more than 40 μm.

7. The IGBT semiconductor device according to claim 1, wherein the field limiting region group includes eight of the field limiting regions.

8. The IGBT semiconductor device according to claim 1, wherein the well region is formed wider than each of the field limiting regions.

9. The IGBT semiconductor device according to claim 1, wherein the well region extends along a peripheral edge of the device region.

10. The IGBT semiconductor device according to claim 1, wherein the well region encloses the device region.

11. The IGBT semiconductor device according to claim 1, wherein the well region has the same electric potential as the impurity region.

12. The IGBT semiconductor device according to claim 1, wherein the well region is formed while being spaced from the field limiting region group.

13. The IGBT semiconductor device according to claim 1, wherein,
the insulating layer covers the field limiting regions,
a plurality of field the electrodes are formed on the insulating layer such as to face the corresponding field limiting region across the insulating layer, and the plurality of field electrode each includes the curved side wall.

14. The IGBT semiconductor device according to claim 1, wherein the field electrode extends along a peripheral edge of the device region.

15. The IGBT semiconductor device according to claim 1, wherein the field electrode encloses the device region.

16. The IGBT semiconductor device according to claim 1, further comprising:
a recess formed in a region between the impurity region and the field limiting region group at the first main surface in the outside region;
wherein the well region is formed in a region along the recess in the surface layer portion of the first main surface.

17. The IGBT semiconductor device according to claim 16, wherein the well region includes a first region formed in a region along a bottom wall of the recess in the surface layer portion of the first main surface, and a second region formed in a region along a side wall of the recess in the surface layer portion of the first main surface, and
a bottom portion of the first region of the well region is positioned at the second main surface side with respect to the bottom portion of the impurity region and the bottom portion of the field limiting region.

18. The IGBT semiconductor device according to claim 17, wherein a bottom portion of the second region is positioned in a region between the first main surface and the bottom portion of the first region of the well region.

19. The IGBT semiconductor device according to claim 18, further comprising:
an inner wall insulating layer covering an inner wall of the recess; and
a recess electrode formed on the inner wall insulating layer such as to face the well region across the inner wall insulating layer.

20. The IGBT semiconductor device according to claim 19, wherein the recess electrode enters the recess from an outside of the recess and faces the well region inside and outside the recess.

21. The IGBT semiconductor device according to claim 1, wherein the field limiting regions each has a second conductivity type impurity concentration higher than a second conductivity type impurity concentration of the impurity region.

* * * * *